US012136901B2

United States Patent
Pham et al.

(10) Patent No.: US 12,136,901 B2
(45) Date of Patent: *Nov. 5, 2024

(54) BROADBAND, HIGH-EFFICIENCY, NON-MODULATING POWER AMPLIFIER ARCHITECTURE

(71) Applicant: MACOM Technology Solutions Holdings, Inc., Lowell, MA (US)

(72) Inventors: Bi Ngoc Pham, Oakville (CN); Gerard Bouisse, Toulouse (FR)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 367 days.

This patent is subject to a terminal disclaimer.

(21) Appl. No.: 17/517,170

(22) Filed: Nov. 2, 2021

(65) Prior Publication Data

US 2022/0060151 A1    Feb. 24, 2022

Related U.S. Application Data

(63) Continuation of application No. 16/639,105, filed as application No. PCT/US2018/046754 on Aug. 14, 2018, now Pat. No. 11,190,143.

(51) Int. Cl.
*H03F 1/02* (2006.01)
*H03F 1/08* (2006.01)
(Continued)

(52) U.S. Cl.
CPC .......... *H03F 1/0288* (2013.01); *H03F 1/083* (2013.01); *H03F 1/42* (2013.01); *H03F 3/211* (2013.01);
(Continued)

(58) Field of Classification Search
CPC .......... H03F 1/0288; H03F 1/083; H03F 1/42; H03F 3/211; H03F 3/213;
(Continued)

(56) References Cited

U.S. PATENT DOCUMENTS 4,375,054 A    2/1983  Pavio
6,085,074 A    7/2000  Cygan
(Continued)

FOREIGN PATENT DOCUMENTS

CN    101494439 A    7/2009
CN    102137518 A    7/2011
(Continued)

OTHER PUBLICATIONS

Michael Steer, Microwave and RF design Module, §2.8 of LibreTexts. (Year: 2019).*
(Continued)

*Primary Examiner* — Hafizur Rahman
(74) *Attorney, Agent, or Firm* — Perilla Knox & Hildebrandt LLP; Jason M. Perilla

(57) ABSTRACT

Apparatus and methods for a no-load-modulation power amplifier are described. No-load-modulation power amplifiers can comprise multiple amplifiers connected in parallel to amplify a signal that has been divided into parallel circuit branches. One of the amplifiers can operate as a main amplifier in a first amplification class and the remaining amplifiers can operate as peaking amplifiers in a second amplification class. The main amplifier can see essentially no modulation of its load between the power amplifier's fully-on and fully backed-off states. The power amplifiers can operate in symmetric and asymmetric modes. Improvements in bandwidth and drain efficiency over conventional (Continued)

Doherty amplifiers are obtained. Further improvements can be obtained by combining signals from the amplifiers with hybrid couplers.

20 Claims, 9 Drawing Sheets

(51) Int. Cl.
    *H03F 1/42*             (2006.01)
    *H03F 3/21*             (2006.01)
    *H03F 3/213*           (2006.01)

(52) U.S. Cl.
    CPC ....... *H03F 3/213* (2013.01); *H03F 2200/387* (2013.01); *H03F 2200/432* (2013.01); *H03F 2200/451* (2013.01); *H03F 2200/543* (2013.01); *H03F 2203/21106* (2013.01); *H03F 2203/21139* (2013.01); *H03F 2203/21142* (2013.01)

(58) Field of Classification Search
    CPC ......... H03F 2200/387; H03F 2200/432; H03F 2200/451; H03F 2200/543; H03F 2203/21106; H03F 2203/21139; H03F 2203/21142
    USPC ........................................................ 330/307
    See application file for complete search history.

(56) References Cited

U.S. PATENT DOCUMENTS

| | | | |
|---|---|---|---|
| 6,262,629 B1 | 7/2001 | Stengel et al. |
| 6,649,287 B2 | 11/2003 | Weeks et al. |
| 6,791,417 B2 | 9/2004 | Pengelly et al. |
| 7,078,976 B2 | 7/2006 | Blednov |
| 7,109,790 B2 | 9/2006 | Kwon et al. |
| 7,218,175 B1 | 5/2007 | Kobayashi |
| 7,414,478 B2 | 8/2008 | Elmala et al. |
| 7,541,866 B2 | 6/2009 | Bowles et al. |
| 7,602,241 B2 | 10/2009 | Suzuki et al. |
| 7,663,434 B2 | 2/2010 | Yang et al. |
| 7,876,159 B2 | 1/2011 | Wang et al. |
| 7,973,600 B2 | 7/2011 | Yu |
| 8,237,498 B2 | 8/2012 | Kato et al. |
| 8,358,174 B2 | 1/2013 | Kim et al. |
| 8,395,450 B2 | 3/2013 | Deguchi et al. |
| 8,466,746 B2 | 6/2013 | Jeong et al. |
| 8,487,703 B2 | 7/2013 | Blednov |
| 9,071,211 B1 | 6/2015 | Ozard |
| 9,083,284 B2 | 7/2015 | Maslennikov et al. |
| 9,331,638 B2 | 5/2016 | Chen et al. |
| 9,531,329 B2 | 12/2016 | Tanimoto |
| 9,543,914 B2 | 1/2017 | Bouny |
| 9,621,115 B1 | 4/2017 | Wu |
| 9,667,199 B1 | 5/2017 | McLaren |
| 9,673,766 B1 | 6/2017 | Roberts et al. |
| 9,774,301 B1 | 9/2017 | Maalouf et al. |
| 9,813,036 B2 | 11/2017 | Folkmann et al. |
| 9,966,903 B1 | 5/2018 | McLaren et al. |
| 10,211,785 B2 | 2/2019 | McLaren |
| 10,284,146 B2 | 5/2019 | Wu et al. |
| 10,284,147 B2 | 5/2019 | Wu et al. |
| 10,305,437 B2 | 5/2019 | Ozard et al. |
| 11,018,629 B2 | 5/2021 | Min et al. |
| 11,050,389 B2 | 6/2021 | Cassou et al. |
| 11,159,125 B2 | 10/2021 | Bouisse et al. |
| 11,190,143 B2 * | 11/2021 | Pham .................. H03F 3/195 |
| 11,233,483 B2 | 1/2022 | Bouisse et al. |
| 11,245,363 B2 | 2/2022 | Bouisse |
| 11,283,410 B2 | 3/2022 | Bouisse |
| 11,496,098 B2 | 11/2022 | Wang |
| 11,515,842 B2 | 11/2022 | Wang et al. |
| 11,522,499 B2 | 12/2022 | Hue et al. |
| 2003/0137346 A1 | 7/2003 | Hellberg |
| 2003/0141933 A1 | 7/2003 | Pengelly |
| 2005/0206462 A1 | 9/2005 | McCorquodale et al. |
| 2006/0097783 A1 | 5/2006 | Okubo et al. |
| 2006/0145757 A1 | 7/2006 | Kim et al. |
| 2007/0205827 A1 | 9/2007 | Mobbs |
| 2010/0315162 A1 | 12/2010 | Gajadharsing et al. |
| 2011/0140775 A1 | 6/2011 | Hong et al. |
| 2011/0193624 A1 | 8/2011 | Scott et al. |
| 2011/0204980 A1 | 8/2011 | Blednov |
| 2012/0025915 A1 | 2/2012 | Ui |
| 2012/0092074 A1 | 4/2012 | Yanduru et al. |
| 2012/0105147 A1 | 5/2012 | Harris et al. |
| 2012/0319780 A1 | 12/2012 | Wilson et al. |
| 2013/0093534 A1 | 4/2013 | Mei |
| 2013/0154729 A1 | 6/2013 | Folkmann et al. |
| 2014/0118070 A1 | 5/2014 | Wilson et al. |
| 2014/0132343 A1 | 5/2014 | Colantonio et al. |
| 2014/0146917 A1 | 5/2014 | Muhammad |
| 2014/0218116 A1 | 8/2014 | Cui et al. |
| 2015/0002227 A1 | 1/2015 | Pribble et al. |
| 2015/0002230 A1 | 1/2015 | Qureshi |
| 2015/0091651 A1 | 4/2015 | Seneviratne et al. |
| 2015/0155838 A1 | 6/2015 | Embar et al. |
| 2015/0180428 A1 | 6/2015 | Pham et al. |
| 2016/0036398 A1 | 2/2016 | Li |
| 2016/0268976 A1 | 9/2016 | Negra et al. |
| 2016/0336903 A1 | 11/2016 | Ahmed et al. |
| 2017/0016322 A1 | 1/2017 | Hagenbuch |
| 2017/0019071 A1 | 1/2017 | Kobayashi et al. |
| 2017/0070193 A1 | 3/2017 | Juang et al. |
| 2017/0085228 A1 | 3/2017 | Adbo et al. |
| 2017/0163221 A1 | 6/2017 | Takagi et al. |
| 2018/0026583 A1 | 1/2018 | Yanduru et al. |
| 2018/0034418 A1 | 2/2018 | Blednov |
| 2018/0034419 A1 | 2/2018 | Moronval |
| 2018/0183388 A1 | 6/2018 | Pham |
| 2018/0191309 A1 | 7/2018 | McLaren |
| 2018/0233578 A1 | 8/2018 | Shi et al. |
| 2018/0248521 A1 | 8/2018 | Min et al. |
| 2018/0254748 A1 | 9/2018 | Grebennikov et al. |
| 2019/0027442 A1 | 1/2019 | Ercoli |
| 2019/0036487 A1 | 1/2019 | Jiang |
| 2019/0333878 A1 | 10/2019 | Wu et al. |
| 2019/0356277 A1 | 11/2019 | Bouisse et al. |
| 2020/0212847 A1 | 7/2020 | Pham et al. |
| 2021/0013572 A1 | 1/2021 | Zhu |
| 2021/0013836 A1 | 1/2021 | Bouisse et al. |
| 2021/0194443 A1 | 6/2021 | Maalouf et al. |
| 2022/0085772 A1 | 3/2022 | Holmes et al. |
| 2022/0123693 A1 | 4/2022 | Wang et al. |
| 2022/0416725 A1 | 12/2022 | Heijden et al. |

FOREIGN PATENT DOCUMENTS

| | | | |
|---|---|---|---|
| CN | 102545788 A | 7/2012 |
| CN | 102577104 A | 7/2012 |
| CN | 103415993 A | 11/2013 |
| CN | 103457541 A | 12/2013 |
| CN | 102549915 A | 4/2015 |
| CN | 104660176 A | 5/2015 |
| CN | 104704747 A | 6/2015 |
| CN | 105322893 A | 2/2016 |
| CN | 105637759 A | 6/2016 |
| CN | 106357222 A | 1/2017 |
| CN | 110785928 A | 2/2020 |
| CN | 107210713 B | 3/2022 |
| EP | 2442444 A1 | 4/2012 |
| EP | 2458730 A1 | 5/2012 |
| EP | 2698918 A1 | 2/2014 |
| EP | 2806557 A1 | 11/2014 |
| EP | 2876810 A1 | 5/2015 |
| EP | 3121960 A1 | 1/2017 |
| EP | 3133735 A1 | 2/2017 |
| EP | 3179628 A2 | 6/2017 |
| EP | 3179638 A1 | 6/2017 |
| EP | 3054589 B1 | 7/2018 |
| JP | 2012222624 A | 11/2012 |
| TW | 336996 B | 2/2011 |

(56) References Cited

FOREIGN PATENT DOCUMENTS

| TW | 377783 | B | 11/2012 |
|---|---|---|---|
| TW | 1462469 | B | 11/2014 |
| TW | 201611514 | A | 3/2016 |
| WO | 2009027916 | A2 | 3/2009 |
| WO | 2015176077 | A2 | 11/2015 |
| WO | 2017192075 | A1 | 11/2017 |
| WO | 2018142176 | A1 | 8/2018 |
| WO | 2018142177 | A1 | 8/2018 |
| WO | 2018142178 | A1 | 8/2018 |
| WO | 2018197917 | A1 | 11/2018 |
| WO | 2018197918 | A1 | 11/2018 |
| WO | 2018197919 | A1 | 11/2018 |
| WO | 2019036499 | A1 | 2/2019 |
| WO | 2019069115 | A1 | 4/2019 |
| WO | 2020072898 | A1 | 4/2020 |
| WO | 2021137951 | A1 | 7/2021 |

OTHER PUBLICATIONS

Office Action in CN Patent Application No. 201880052630, with Search Report, Mailed Mar. 31, 2023, with Translation.
Cheng et al., "GaN HEMT Based Doherty Broadband Power Amplifier," Journal of Hangzhou Dianzi University (Natural Sciences), Mar. 15, 2017.
Barthwal Ayushi et al, "A Design Strategy for Bandwidth Enhancement in Three-Stage Doherty Power Amplifier With Extended Dynamic Range", IEEE Transactions on Microwave Theory and Techniques, Plenum, USA, vol. 66, No. 2, ISSN 0018-9480, Feb. 2018.
Ceylan et al, "Refine Biasing Networks for High PA Low Frequency Stability," Microwave & RF, Apr. 17, 2018, pp. 1-6.
Daehyun Kang et al, "30.3% PAE HBT Doherty power amplifier for 2.5-2.7 GHZ mobile WiMAX," Microwave Symposium Digest (MTT), 2010 IEEE MTT-S International, IEEE, Piscataway, NJ, USA, Piscataway, NJ, USA, (May 23, 2010), ISBN 978-1-4244-6056-4, pp. 796-799.
Daekyu Yu et al, "Fully Integrated Doherty Power Amplifiers for 5 GHz Wireless-LANs", Radio Frequency Integrated Circuits (RFIC) Symposium, 2006 IEEE, IEEE, Piscataway, NJ, USA, (Jun. 11, 2006), doi:10.1109/RFIC.2006.1651114, ISBN 978-0-7803-9572-5, pp. 153-156.
Daniel Popp et al, "High Power and High Bandwidth Digital Three-Way Doherty Power Amplifier", 2019 IEEE 20TH Wireless and Microwave Technology Conference (WAMICON), IEEE, (20190408), doi:10.1109/WAMICON.2019.8765455, pp. 1-6, XP033577671.
International Search Report and Written Opinion in Application No. PCT/US2020/060158, dated Mar. 10, 2021.
Office Action for European Application No. 17825920.6 dated Dec. 1, 2021.
Office Action for Taiwanese Application No. 107113817 dated Oct. 6, 2021, with Translation.
Office Action from European Application No. 17728258.9 dated May 27, 2021.
Office Action from European Application No. 17732555.2 dated Aug. 11, 2021.
Office Action from European Application No. 17734137.7 dated Aug. 9, 2021.
Office Action in CN Application No. 201780092425.1, Mailed Jan. 10, 2023, With Summary.
Office Action in CN Patent Application No. 2017800924285, Mailed Dec. 23, 2022, with Translation.
Office Action in EP 17726356.3, Mailed May 20, 2021.
Office Action in EP 18759225.8, Mailed Oct. 27, 2021.
Office Action in TW Application No. 107103816, with Search Report, Mailed Feb. 25, 2021, with Translation.
Office Action in TW Application No. 107103822, with Search Report, Mailed Feb. 24, 2021, with Translation.
Office Action in TW Patent Application No. 107113817 Mailed Jan. 21, 2021, with Translation.
Search Report for Taiwanese Application No. 107113802 mailed May 26, 2021.
Translation of Office Action in TW Patent Application No. 107103832, with Search Report Mailed Feb. 25, 2021.
Vigneau et al, "Fully integrated three-way LDMOS Doherty PAs for 1.8-2.2 GHz dual-band and 2.6 GHz m-MIMO 5G applications," Published in International Journal of Microwave and Wireless Technologies, Mar. 1, 2021.
Xia Jing et al, "Improved Three-Stage Doherty Amplifier Design With Impedance Compensation in Load Combiner for Broadband Applications", IEEE Transactions on Microwave Theory and Techniques, Plenum, USA, vol. 67, No. 2, doi:10.1109/TMTT.2018.2884404, ISSN 0018-9480, (Feb. 1, 2019), pp. 778-786.
International Search Report and Written Opinion for Application No. PCT/IB2017/000727 mailed on Oct. 19, 2017.
International Search Report and Written Opinion for Application No. PCT/IB2017/000608 mailed on Sep. 8, 2017.
International Preliminary Report on Patentability for International Application No. PCT/IB2017/000608, mailed Oct. 29, 2019.
International Search Report and Written Opinion for Application No. PCT/IB2017/000717 mailed Dec. 6, 2017.
International Preliminary Report on Patentability for International Application No. PCT/IB2017/000717, mailed Aug. 6, 2019.
International Search Report and Written Opinion for Application No. PCT/IB2017/000722 mailed Nov. 7, 2017.
International Preliminary Report on Patentability for International Application No. PCT/IB2017/000722, mailed Aug. 6, 2019.
International Search Report and Written Opinion for Application No. PCT/US2017/068164 mailed Mar. 13, 2018.
International Preliminary Report on Patentability for International Application No. PCT/US2017/068164 mailed Apr. 3, 2019.
Office Action from European Application No. 17726354.8 mailed May 27, 2021.
International Search Report and Written Opinion for Application No. PCT/IB2018/046754 mailed on Nov. 22, 2018.
International Search Report and Written Opinion for Application No. PCT/IB2017/001575 mailed on Jun. 18, 2018.
International Search Report and Written Opinion for Application No. PCT/IB2017/000639 mailed Sep. 8, 2017.
International Preliminary Report on Patentability for International Application No. PCT/IB2017/000639, mailed Oct. 29, 2019.
International Search Report and Written Opinion for Application No. PCT/IB2017/000604 mailed Sep. 8, 2017.
International Preliminary Report on Patentability for International Application No. PCT/IB2017/000604 mailed Oct. 29, 2019.
International Search Report and Written Opinion for International Application No. PCT/US2019/054686, mailed Dec. 19, 2019.
Camarchia et al., 7 Ghz MMIC GaN Doherty Power Amplifier With 47% Efficiency at 7 dB Output Back-Off. IEEE Microwave and Wireless Components Letters. Jan. 2013; 23(1):34-6.
Campbell, A Fully Integrated Ku-Band Doherty Amplifier MMIC. IEEE Microwave and Guided Wave Letters. Mar. 1999; 9(3):114-6.
Cidronali et al., Frequency Analysis and Multiline Implementation of Compensated Impedance Inverter for Wideband Doherty High-Power Amplifier Design. IEEE Transactions on Microwave Theory and Techniques. May 2016;64(5):1359-72.
Grebennikov et al., High-Efficiency Doherty Power Amplifiers: Historical Aspect and Modem Trends. Proceedings of the IEEE. Dec. 2012; 100(12):3190-219.
Kim et al., Doherty Linear Power Amplifiers for Mobile Handset Applications. Proceedings of Asia-Pacific Microwave Conference. Dec. 2006;1885-94.
Merrick et al., A wideband sequential power amplifier. 2014 IEEE MTT-S International Microwave Symposium (IMS2014). Jun. 1, 2014:1-3.
Moronval et al., A 100 W Multi-Band Four-Way Integrated Doherty Amplifier. IEEE MTT-S International Microwave Symposium (IMS) May 22, 2016:1-3.
Quaglia et al., K-Band GaAs MMIC Doherty Power Amplifier for Microwave Radio With Optimized Driver. IEEE Transactions on Microwave Theory and Techniques. Nov. 2014;62(11):2518-25.

(56) References Cited

OTHER PUBLICATIONS

Roberts, Understanding the 3 Level Doherty. 11th European Microwave Integrated Circuits Conference (EUMIC), European Microwave Association. Oct. 3, 2016:428-32.
Wicks et al., A 60-GHz Fully-Integrated Doherty Power Amplifier Based on 0.13-µm CMOS Process. Radio Frequency Integrated Circuits Symposium. Jun. 17, 2008;69-72.
Yu et al., Fully Integrated Doherty Power Amplifiers for 5 GHz Wireless-LANs. IEEE Radio Frequency Integrated Circuits Symposium (RFIC). Jun. 11, 2006;153-6.
Zhou et al., Design of an S-Band Two-Way Inverted Asymmetrical Doherty Power Amplifier for Long Term Evolution Applications. Progress in Electromagnetics Research Letters. Apr. 2013;39:73-80.
Andrei Grebennikov, "A high-efficiency 100-W four-stage Doherty GaN H EMT power amplifier module for WCDMA systems", 2011 IEEE MTT-S International Microwave Symposium (Year: 2011).
Non-Final Office Action for U.S. Appl. No. 16/639,105 mailed Apr. 6, 2021.

\* cited by examiner

BROADBAND, HIGH-EFFICIENCY, NON-MODULATING POWER AMPLIFIER ARCHITECTURE

CROSS REFERENCE TO RELATED APPLICATIONS

This application is a Continuation of U.S. patent application Ser. No. 16/639,105, filed on Feb. 13, 2020, and titled "BROADBAND, HIGH-EFFICIENCY, NON-MODULATING POWER AMPLIFIER ARCHITECTURE," which is a 35 U.S.C. § 371 National Stage Patent Application of Patent Cooperation Treaty Application number PCT/US2018/046754, filed on Aug. 14, 2018, and titled "BROADBAND, HIGH-EFFICIENCY, NON-MODULATING POWER AMPLIFIER ARCHITECTURE," the entire contents of both of which applications are hereby incorporated herein by reference.

BACKGROUND

Technical Field

The technology relates to high-speed, efficient, high-power amplifiers which can be constructed from multiple transistors operating in parallel circuit paths and formed from semiconductor materials such as, but not limited to, gallium nitride.

Discussion of the Related Art

High-speed power amplifiers formed from semiconductor materials have a variety of useful applications, such as radio-frequency (RF) communications, radar, RF energy, power conversion, and microwave applications. Gallium nitride semiconductor material has received appreciable attention in recent years because of its desirable electronic and electro-optical properties. Because of its wide bandgap, GaN is more resistant to avalanche breakdown and can maintain electrical performance at higher temperatures than other semiconductors, such as silicon. GaN also has a higher carrier saturation velocity and can sustain higher power densities compared to silicon. Additionally, GaN has a Wurtzite crystal structure, is a very stable and hard material, has a high thermal conductivity, and has a much higher melting point than other conventional semiconductors such as silicon, germanium, and gallium arsenide. Accordingly, GaN is useful for high-speed, high-voltage, and high-power applications.

Applications supporting mobile communications and wireless internet access under current and proposed communication standards, such as WiMax, 4G, and 5G, can place austere performance demands on high-speed amplifiers constructed from semiconductor transistors. The amplifiers may need to meet performance specifications related to output power, signal linearity, signal gain, bandwidth, and efficiency.

SUMMARY

Apparatus and methods for amplifying radio-frequency signals are described. A multiclass power amplifier can include a plurality of amplifiers operating in parallel in different amplification classes and providing amplified signals to a common output. A main amplifier can amplify signals at low signal levels and high signal levels. Secondary amplifiers can be idle (non-amplifying) at low signal levels and become active (amplifying) as signal levels increase. The main amplifier can see a same impedance at its output regardless of whether the secondary amplifiers are idle or active, thereby avoiding load modulation of the main amplifier that is typical with conventional Doherty amplifiers.

Some embodiments relate to a power amplifier comprising a first circuit branch containing a first amplifier and a second amplifier connected in parallel, wherein the first amplifier is configured to operate in class AB and the second amplifier is configured to operate in a different class, and a second circuit branch connected in parallel with the first circuit branch, the second circuit branch containing a third amplifier configured to operate in the different class. The power amplifier can further include a first node arranged to receive output signals from the first amplifier and the second amplifier, a second node arranged to receive an output signal from the third amplifier, a first impedance inverter connected between the first node and a combining node, a second impedance inverter connected between the second node and the combining node, and an output port connected to the combining node and configured to connect to a load having an impedance value R.

Some embodiments relate to a method for amplifying a signal. The method can comprise acts of receiving a first signal at a first amplifier that operates in class AB; receiving a first replica of the first signal at a second amplifier connected in parallel with the first amplifier, wherein the second amplifier operates in a different class; receiving a second replica of the first signal at a third amplifier that operates in the different class; combining an output from the first amplifier with an output from the second amplifier to produce a first output; providing the first output to a first impedance inverter; providing a second output from the third amplifier to a second impedance inverter; and combining an output from the first impedance inverter and the second impedance inverter to produce a combined output.

Some embodiments relate to a power amplifier comprising a main amplifier connected in parallel with a first peaking amplifier in a first circuit branch, and a second peaking amplifier connected in parallel with a third peaking amplifier in a second circuit branch that is in parallel with the first circuit branch, wherein the main amplifier is configured to operate in a first amplifier class and the peaking amplifiers are configured to operate in an amplifier class that is different from the first amplifier class, wherein a load impedance seen by the main amplifier is approximately a same value when the peaking amplifiers are fully amplifying received signals and when the peaking amplifiers are not amplifying received signals.

Some embodiments relate to a method of operating a power amplifier comprising acts of at a first time: in a first circuit branch of the power amplifier, amplifying a first portion of a first received signal with a main amplifier that is connected in parallel with a first peaking amplifier that is not amplifying; and at a second time: amplifying a first portion of a second received signal with the main amplifier; amplifying a second portion of the second received signal with the first peaking amplifier in a fully-on state; amplifying a third portion of the second received signal with a second peaking amplifier in a fully-on state; and amplifying a forth portion of the second received signal with a third peaking amplifier in a fully-on state that is connected in parallel with the second peaking amplifier in a second circuit branch of the power amplifier, wherein a load impedance seen by the main amplifier at the first time is approximately a same value to a load impedance seen by the main amplifier at the second time.

Some embodiments relate to a power amplifier comprising a main amplifier connected in parallel with a first peaking amplifier in a first circuit branch; and a second peaking amplifier in a second circuit branch that is in parallel with the first circuit branch, wherein the main amplifier is configured to operate in a first amplifier class and the first and second peaking amplifiers are configured to operate in an amplifier class that is different from the first amplifier class, wherein a load impedance seen by the main amplifier is approximately a same value when the peaking amplifiers are fully amplifying received signals and when the peaking amplifiers are not amplifying received signals.

Some embodiments relate to a method of operating a power amplifier comprising acts of at a first time: in a first circuit branch of the power amplifier, amplifying a first portion of a first received signal with a main amplifier that is connected in parallel with a first peaking amplifier that is not amplifying; and at a second time: amplifying a first portion of a second received signal with the main amplifier; amplifying a second portion of the second received signal with the first peaking amplifier in a fully-on state; and amplifying a third portion of the second received signal with a second peaking amplifier in a fully-on state that is connected in parallel with the first circuit branch of the power amplifier, wherein a load impedance seen by the main amplifier at the first time is approximately a same value to a load impedance seen by the main amplifier at the second time.

Some embodiments relate to a power amplifier comprising: a main amplifier connected in a first circuit branch; a first peaking amplifier in a second circuit branch that is in parallel with the first circuit branch, wherein the main amplifier is configured to operate in a first amplifier class and the first peaking amplifier is configured to operate in an amplifier class that is different from the first amplifier class; and a hybrid coupler arranged to combine a first signal from the first circuit branch with a second signal from the second circuit branch.

Some embodiments relate to a method of operating a power amplifier comprising acts of at a first time: in a first circuit branch of the power amplifier, amplifying a first portion of a first received signal with a main amplifier; and at a second time: amplifying a first portion of a second received signal with the main amplifier; amplifying a second portion of the second received signal with a first peaking amplifier in a fully-on state in a second circuit branch of the power amplifier that is in parallel to the first circuit branch; and combining a signal from the first circuit branch with a signal from the second circuit branch with a hybrid coupler.

The foregoing apparatus and method embodiments may be implemented with any suitable combination of aspects, features, and acts described above or in further detail below. These and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the embodiments may be shown exaggerated or enlarged to facilitate an understanding of the embodiments. The drawings are not necessarily to scale, emphasis instead being placed upon illustrating the principles of the teachings. In the drawings, like reference characters generally refer to like features, functionally similar and/or structurally similar elements throughout the various figures. Where the drawings relate to microfabricated circuits, only one device and/or circuit may be shown to simplify the drawings. In practice, a large number of devices or circuits may be fabricated in parallel across a large area of a substrate or entire substrate. Additionally, a depicted device or circuit may be integrated within a larger circuit.

When referring to the drawings in the following detailed description, spatial references "top," "bottom," "upper," "lower," "vertical," "horizontal," and the like may be used. Such references are used for teaching purposes, and are not intended as absolute references for embodied devices. An embodied device can be oriented spatially in any suitable manner that may be different from the orientations shown in the drawings. The drawings are not intended to limit the scope of the present teachings in any way.

Features and advantages of the illustrated embodiments will become more apparent from the detailed description set forth below when taken in conjunction with the drawings.

DETAILED DESCRIPTION

Figure 1:
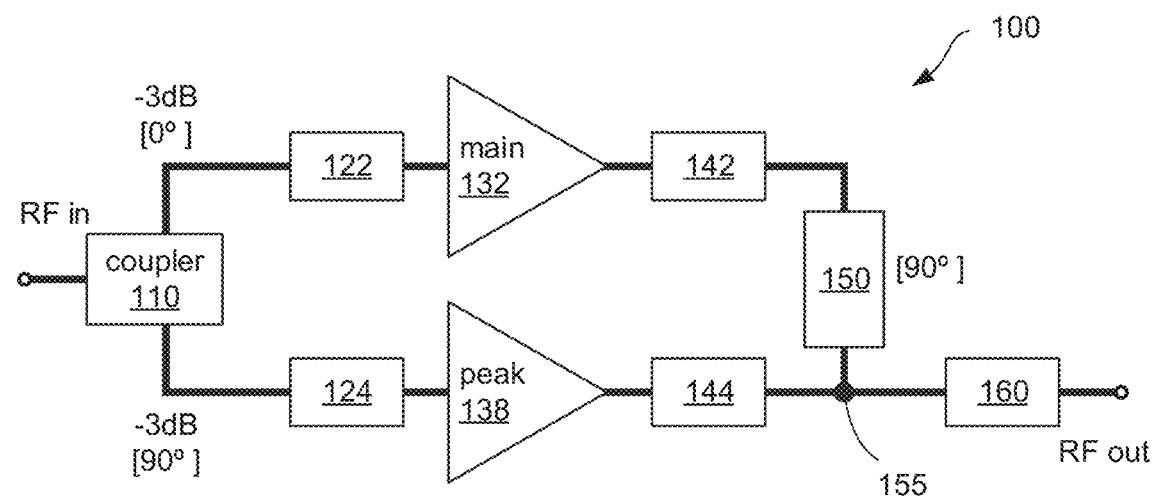
FIG. 1 depicts an arrangement of a Doherty amplifier.

One approach to amplifying signals to high power levels for communications is to use a Doherty amplifier, which is depicted schematically in FIG. 1. To aid in understanding the present technology, a brief summary of Doherty amplification is provided.

A Doherty amplifier 100 may comprise a main power amplifier 132 and a peaking power amplifier 138 that operate in parallel on a signal divided into parallel circuit branches. The peaking amplifier 138 is typically idle (not amplifying) at low signal levels, and turns on when the main amplifier 132 begins to saturate. Outputs from the two amplifiers are subsequently combined into a single RF output.

In further detail, a 90-degree power coupler 110 divides a received RF signal into two outputs that connect to the main amplifier 132 and the peaking amplifier 138. The power coupler 110 also delays (by approximately 90 degrees) the phase of the signal provided to the peaking amplifier with respect to the phase of the signal provided to the main amplifier. Impedance-matching components 122, 124 may be placed before the main amplifier 132 and peaking amplifier 138. These impedance-matching components can transform impedance so as to match the input impedances of the two amplifiers 132, 138 to the impedances of the transmission lines connected to the amplifier inputs or to output impedances from the 90-degree coupler 110. Such impedance matching can reduce undesirable effects of signal reflections from the amplifiers.

Additional impedance-matching components 142, 144 may be located at the outputs of the main amplifier 132 and peaking amplifier 138 to match impedances between the output of the main amplifier 132 to the input of an impedance inverter 150 (which may be 50 ohms by design) and between the output of the peaking amplifier 138 and an impedance at the combining node 155 (which may also be 50 ohms). The impedance inverter 150 rotates the phase of the signal received from the main amplifier 132 by approximately 90 degrees, so that the signals from the main amplifier and peaking amplifier will be essentially in phase at the combining node 155. An output impedance-matching element 160 may be used between the combining node 155 and the Doherty amplifier's RF output to match the output impedance of the Doherty amplifier 100 to an impedance of a load (not shown).

In a symmetric Doherty amplifier, the main amplifier 132 and peaking amplifier 138 may be closely similar or identical semiconductor devices. For example, they may be configured to handle a same amount of signal power and amplify a signal to a same power level when both amplifiers are fully on and amplifying at their upper limit. Because the input signal is split equally to the two amplifiers, the signals to the main amplifier 132 and peaking amplifier are typically attenuated by 3 dB at each output port of the coupler 110 compared to the input RF signal. Signal values expressed in "dB" refer to relative power levels.

Figure 2A:
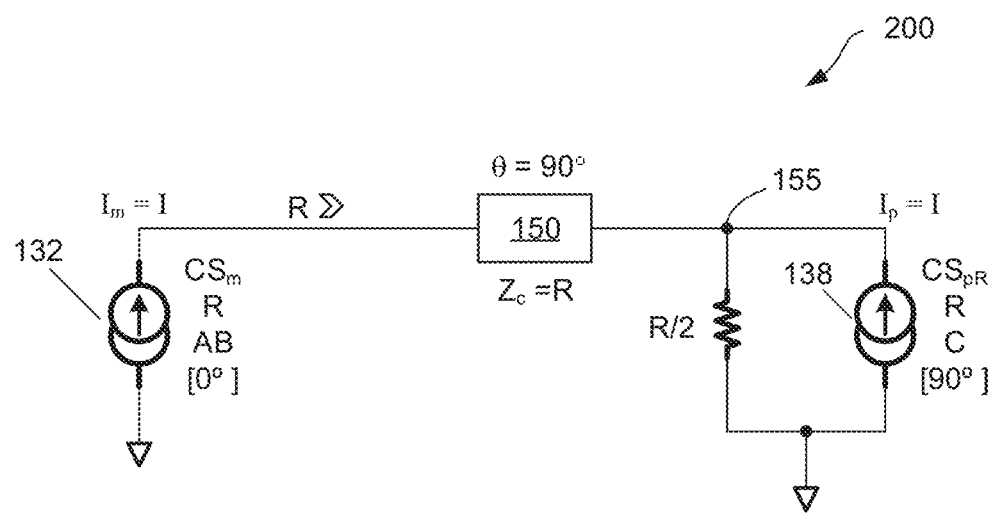
FIG. 2A depicts a circuit model for a symmetrical Doherty amplifier when a main amplifier and peaking amplifier are fully active.

Operational aspects of a Doherty amplifier are illustrated in further detail in FIG. 2A through FIG. 4. FIG. 2A is a simplified circuit model for a Doherty amplifier when both the main amplifier 132 and peaking amplifier 138 are fully active (amplifying their respective signals at full-power values). The main amplifier 132 operating in class AB mode and its output impedance-matching component 142 can be modeled as a current source $CS_m$ having an internal impedance R and providing no phase delay to the amplified signal. The peaking amplifier 138 operating in class C mode, its output impedance-matching component 144, and the phase delay of the coupler 110 can be modeled as a second current source $CS_p$ having an internal impedance R, but providing a 90-degree phase delay to amplified signals. The impedance inverter 150 can be modeled as a transmission line having a characteristic impedance of R and providing a phase delay of 90 degrees. According to some embodiments, a load driven by the Doherty amplifier may have an impedance of R/2.

The phase delays described herein are delays for a carrier wave of a radio-frequency signal that is modulated to encode information onto the carrier wave. For example, a carrier wave may oscillate at a frequency having a value in a range between 0.7 gigahertz (GHz) and 7 GHz, depending on what communication protocol is being used (e.g., 2G, 3G, 4G, etc.). The main amplifier 132 and peaking amplifier 138 may be designed for a particular carrier frequency and communication protocol. As one non-limiting example, an amplifier configured to handle signals for 4G communications may be designed for a carrier frequency of 2.6 GHz according to one protocol, and the specified phase delays of amplifier components are relative to 2.6 GHz. As another non-limiting example, an amplifier configured to handle signals for 4G communications may be designed for a carrier frequency of 1.9 GHz according to another protocol, and the specified phase delays of amplifier components are relative to 1.9 GHz.

When both the main amplifier 132 and peaking amplifier 138 are active and driving a load of R/2 with approximately equal amounts of current I, as depicted in FIG. 2A, straightforward calculations show that the main amplifier 132 sees an impedance R at its output, as indicated by the chevron symbol in FIG. 2A. This is referred to as a "1:1 load" condition for the Doherty amplifier. This impedance value can be calculated in a two-step process. First, the impedance seen looking into the combining node 155 from the impedance inverter 150 is calculated. Second, the impedance looking into the combining node is transformed according to the property of the quarter-wave impedance inverter 150 to find an impedance (in this case R) looking into the impedance inverter 150.

Figure 2B:
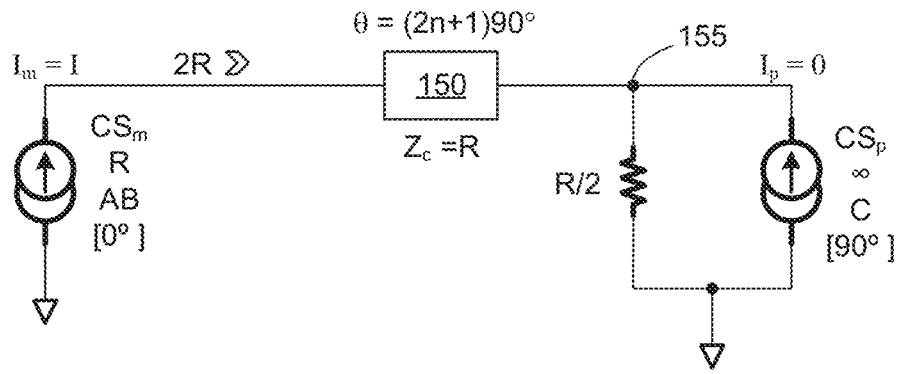
FIG. 2B depicts a circuit model for a symmetrical Doherty amplifier when a main amplifier is active and a peaking amplifier is idle (non-amplifying)

FIG. 2B depicts a circuit model for an operating condition of the Doherty amplifier when the peaking amplifier 138 is idle (non-amplifying). When an input RF signal to be amplified by the Doherty amplifier falls below a threshold value, the peaking amplifier 138 becomes idle (non-amplifying) and is modeled as essentially as an open circuit. For this model, the impedance of the peaking amplifier changes from R to an infinite value in an idle state. Recalculating impedances looking into the combining node 155 and looking into the impedance inverter 150 from the main amplifier shows that the impedance value seen looking into the impedance inverter 150 rises to 2R. This operating condition is referred to as the "2:1 load" condition of the Doherty amplifier. In this case, the main amplifier's impedance R is no longer well matched to the impedance it is trying to drive.

Such a mismatch can lead to signal reflections and inefficient operation of the Doherty amplifier.

The variation in impedance seen by the main amplifier 132 that depends on the state of the peaking amplifier 138 (which is determined by the input RF signal level) is referred to as "load modulation." Load modulation necessarily adversely affects power-handling capability of the amplifier and the amplifier's RF fractional bandwidth. For example, mismatches in impedance cause power reflections, and such reflections to the main amplifier may constrain the safe operating limit of the main amplifier appreciably below a power level that it could otherwise handle if there were no power reflections. The amount of reflected power may further depend on frequency, and changes in reflected power with frequency can take an amplifier out of compliance with a specification more quickly (resulting in a narrower bandwidth) than if there were no reflected power.

Figure 3:
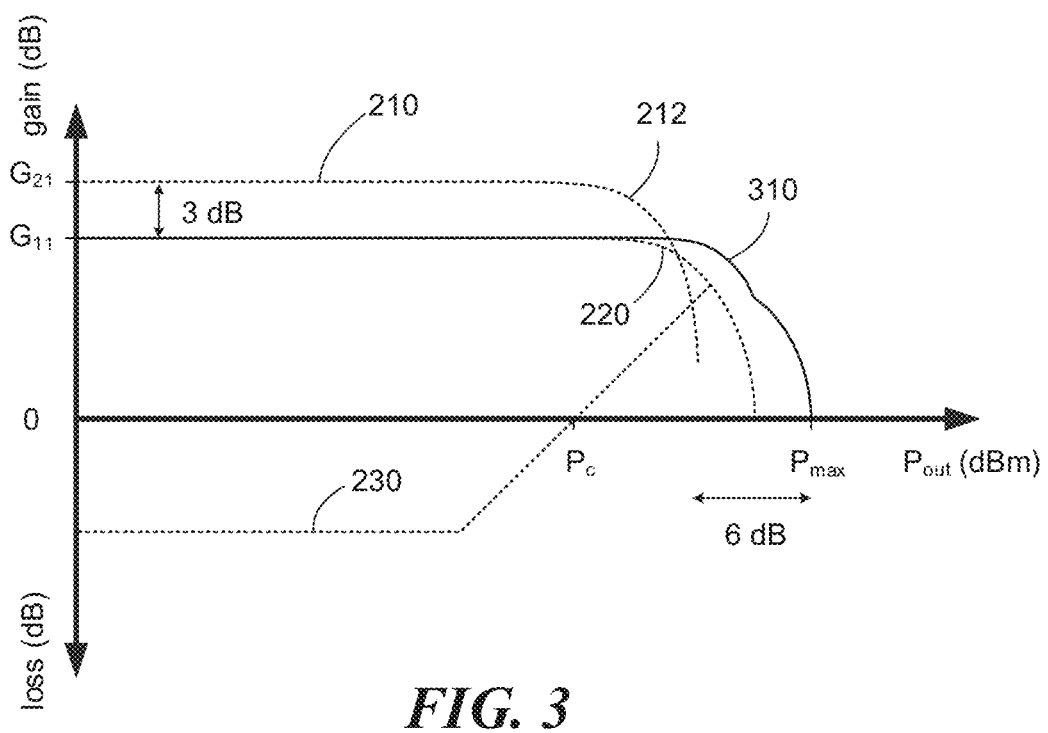
FIG. 3 illustrates gain as a function of output power for a Doherty amplifier.
Figure 4:
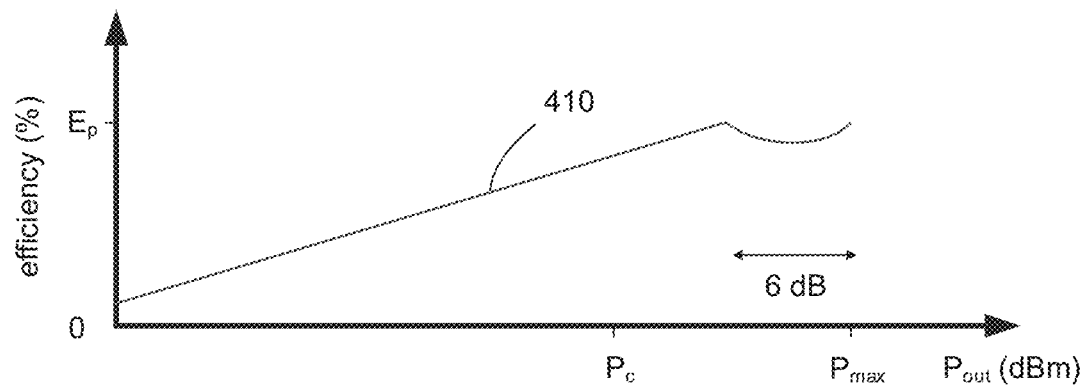
FIG. 4 illustrates efficiency of a Doherty amplifier as a function of output power.

Additional details of a Doherty amplifier's gain and efficiency dynamics are illustrated in FIG. 3 and FIG. 4. In FIG. 3, a first gain curve 210 (dotted line) depicts gain of a main amplifier 132 as a function of output power $P_{out}$ when the peaking amplifier 138 is idle (non-amplifying). The curve 210 corresponds to the so-called 2:1 load condition. The peaking amplifier is typically idle at low input signal power levels, e.g., input signal levels that will not begin saturating the main amplifier 132. These low input signal levels correspond to output power levels that are up to about 6 dB below a peak output power level of the Doherty amplifier. These low level signals can be handled by the main amplifier 132 only. At higher signal levels, the gain of the main amplifier 132 will begin to saturate and go into "compression," which begins at a power compression point Pc and is indicated by the fall-off region 212 in FIG. 3. At this point, the main amplifier 132 begins to amplify non-linearly, and would otherwise distort the input RF signal. The power compression point for a main amplifier 132 will depend upon its design (e.g., the size of active areas in the amplifier's transistors), and could be any value from 1 Watt (30 dBm) to 100 Watts (50 dBm) for an amplifier used in a communication system. Smaller or larger values of the power compression point may occur in some embodiments.

For a Doherty amplifier, the peaking amplifier 138 begins to amplify the input RF signal and contribute to the Doherty amplifier's output at the power compression point Pc. An example gain curve 230 for the peaking amplifier 138 is also depicted in FIG. 3. The peaking amplifier 138 makes up for saturation of the main amplifier 132 at high powers until the peaking amplifier begins to saturate, go into compression, and fall off, as indicated in the drawing. Action of the peaking amplifier 138 can extend linear amplification by the Doherty amplifier over a range of high powers beyond the capability of the main amplifier 132 alone, until the peaking amplifier starts saturating.

FIG. 3 includes a second gain curve 220 for the main amplifier 132 when the peaking amplifier 138 is active (amplifying). The curve 220 corresponds to the 1:1 load condition. When the peaking amplifier 138 is active, it effectively adds load impedance to the main amplifier 132 (effectively reducing the gain of the main amplifier by about 3 dB) but also assists in amplifying high power levels (extending the Doherty's compression to higher powers). FIG. 3 also depicts a gain curve 310 (solid dark curve) as a function of output power for the Doherty amplifier. The Doherty gain curve 310 is a result of the combined actions of the main amplifier 132 and peaking amplifier 138 as described above.

An efficiency curve 410 for a Doherty amplifier is illustrated in FIG. 4. The efficiency of the Doherty rises to a peak efficiency $E_p$ that occurs approximately when the gain of the peaking amplifier 138 has reached its highest value. Ideally in a Doherty amplifier, the peak efficiency $E_p$ would occur at about 6 dB below the maximum output power $P_{max}$, in a region referred to as "output power back-off" (OBO, though sometimes denoted OPO). The efficiency falls below the peak value $E_p$ for output power levels below the 6 dB OBO point in a region where the peaking amplifier is transitioning from low gain levels (where the peaking amplifier primarily loads the main amplifier) to its maximum gain (refer to FIG. 3).

In reality, the peak efficiency for a Doherty does not occur at 6 dB OBO, because of several effects present in conventional Doherty amplifiers. A first effect relates to isolation of the peaking amplifier 138 in power back-off. Although the peaking amplifier is modeled above as having infinite impedance (open circuit) in back-off, in practical applications the impedance is finite at 6 dB OBO. Further, the impedance inverter 150 and/or output matching elements 142, 144 can exhibit losses which may not be insignificant. Additionally, the main amplifier 132 and peaking amplifier 138 typically have non-ideal I-V curves and/or knee voltages. All these effects can cause the peak efficiency to occur at a value that is less than 6 dB OBO (e.g., about 5 dB OBO or less), which in turn causes the Doherty amplifier's efficiency to be reduced further than shown in FIG. 4 in a region of about 8 dB OBO to about 9 dB OBO.

The inventors have recognized and appreciated that load modulation in a Doherty amplifier can adversely affect power handling and bandwidth capability of a Doherty amplifier. The inventors have also recognized and appreciated that conventional Doherty amplifiers exhibit a peak efficiency in a region between about 5 dB OBO and about 6 dB OBO. The inventors have further recognized and appreciated that currently-developed signal protocols can increase the peak-to-average power ratio (PAPR) in communication signals to 7 dB or more to handle large data rates with high spectral efficiency. As a result, to preserve amplifier linearity a Doherty amplifier may be operated in a corresponding region (7 dB OBO or more) for a large portion of its operating time, which is a region where the conventional Doherty amplifier's efficiency is reducing.

Figure 5A:
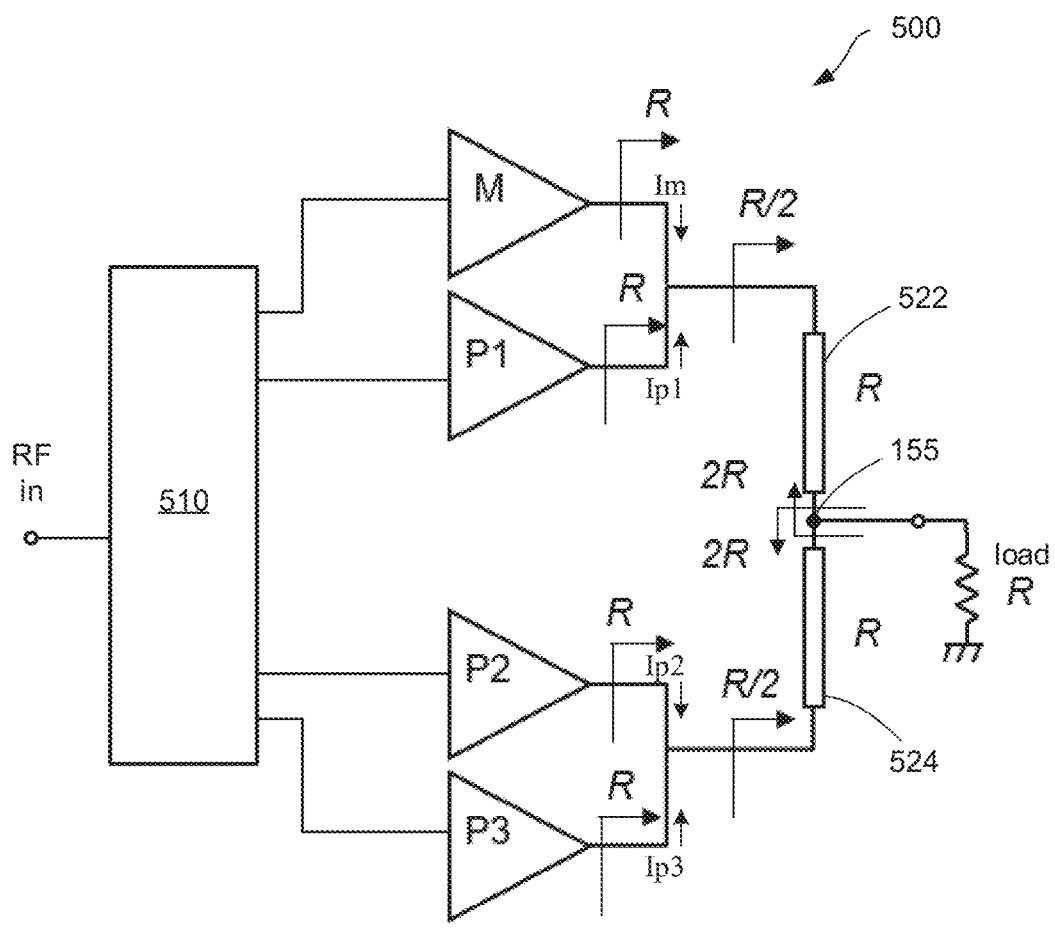
FIG. 5A depicts a high-efficiency, broadband, no-load-modulation power amplifier and shows impedance values when the amplifier is fully on, according to some embodiments.

The inventors have conceived of a no-load-modulation, improved-efficiency, broadband, multiclass power amplifier that can exhibit a peak efficiency at back-off power margins of 6 dB or more. The main amplifier is essentially free of load modulation effects caused by transitions from "on" to "idle" states of the peaking amplifiers. An example of a no-load-modulation power amplifier 500 is depicted in FIG. 5A.

A no-load-modulation power amplifier 500 can comprise a plurality of amplifiers M, P1, P2, P3 operating on portions of a received signal, e.g., a received RF signal that is divided into parallel circuit branches. The received signal at an input port to the amplifier can be divided into the parallel circuit branches by signal dividing circuitry 510 and provided to the plurality of amplifiers M, P1, P2, P3. A first circuit branch can include a main amplifier M and a first peaking amplifier P1 connected in parallel. A second circuit branch can include a second peaking amplifier P2 and a third peaking amplifier P3 connected in parallel. Outputs from the amplifiers in the first and second circuit branches can be combined at a combining node 155 and subsequently provided to an output port or terminal 590 of the no-load-modulation power amplifier. The output port can be connected to a load (having an impedance value of R in the illustrated example).

The parallel circuit branches can include a first quarter-wave impedance inverter 522 and a second quarter-wave impedance inverter 524 connected as shown. The characteristic impedance of the first and second impedance inverters 522, 524 may be the same (R in the example implementation) or may be different in other embodiments. In some implementations, the characteristic impedance of the first and second impedance inverters 522, 524 are the same value R to within 5% (i.e., R±0.05R). In some cases, the characteristic impedance of the first and second impedance inverters 522, 524 are the same value R to within 20%. In embodiments, R can have a real value of impedance between 10 ohms and 100 ohms, and can be determined by an impedance of a load that the power amplifier is designed to drive.

A first amplifier M of the plurality of amplifiers can be configured to operate as a main amplifier in a first amplifying class. For example, the first amplifying class may be class A, class B, or class AB. The remaining amplifiers P1, P2, P3 (which may be referred to as peaking amplifiers) can be configured to operate as peaking amplifiers in a second class (e.g., class C). According to some embodiments, a first portion of the plurality of amplifiers M, P1 can operate on portions of the received signal to be amplified, wherein the portions of the received signal have a first phase. A second portion of the plurality of amplifiers P2, P3 can operate on portions of the received signal that have a second phase different from the first phase. The second phase can be delayed between 80° and 100° with respect to the first phase, in some embodiments. In some embodiments, the second phase may not be delayed with respect to the first phase, or may be delayed by an integer multiple of 360°. When there is a phase delay (other than an integer multiple of approximately 360°) between signals provided to the first portion of amplifiers M, P1 with respect to signals provided to the second portion of amplifiers P2, P3, then one or more compensating phase delays can be connected to outputs of at least some of the plurality of amplifiers so that signals combine at the combining node 155 in phase or approximately in phase.

A no-load-modulation power amplifier 500 can include signal dividing circuitry 510 that can comprise any suitable power splitters and/or couplers arranged in a network that divide the input signal into different signal paths. In some cases, the input signal can be divided into approximately equal power levels (a symmetric configuration) that are provided to the plurality of amplifiers. In other cases, the input signal can be divided into unequal power levels (an asymmetric configuration) that are provided to the plurality of amplifiers. In some implementations, the signal dividing circuitry 510 can include impedance-matching components that match input impedances of the plurality of amplifiers M, P1, P2, P3 to upstream components. To simplify the drawings, the signal dividing circuitry 510 may not be shown in alternative embodiments of a no-load-modulation power amplifier. In some cases, the signal dividing circuitry can introduce a phase difference between at least two of the signals that are output to the amplifiers. For example, the signal dividing circuitry can introduce a phase difference of approximately 90° between a signal provided to the main amplifier and at least one of the signals provided to a peaking amplifier. In some implementations, the phase difference introduced by the signal dividing circuitry can be between 80° and 100°.

In some embodiments, each of the amplifiers M, P1, P2, P3 can be embodied as an integrated circuit comprising one or more transistors. In some cases, the transistors may be formed from gallium-nitride material as field-effect transistors, bipolar transistors, or high-electron-mobility transistors (HEMTs), though other types of transistors may be used in some embodiments. For example, a main amplifier M can be microfabricated on a wafer that is cut to provide at least one die that includes an array of GaN HEMT devices. The die can be attached to a circuit board or a microwave monolithic integrated circuit (MMIC) that also includes the peaking amplifiers P1, P2, P3, the signal dividing circuitry 510, and the impedance inverters 522, 524, in some implementations. Each of the peaking amplifiers can be fabricated on a semiconductor wafer that is cut to form individual die. Additional circuit elements (e.g., impedance-matching components, phase delay elements, microstrip transmission lines, etc.) can be included on the circuit board or MMIC.

As used herein, the phrase "gallium-nitride material" refers to gallium nitride (GaN) and any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphoride nitride ($GaAs_xP_yN_{(1-x-y)}$), aluminum indium gallium arsenide phosphoride nitride ($Al_xIn_yGa_{(1-x-y)}As_aP_bN_{(1-a-b)}$), amongst others. Typically, when present, arsenic and/or phosphorous are at low concentrations (i.e., less than 5 percent by weight). In certain preferred embodiments, the gallium-nitride material has a high concentration of gallium and includes little or no amounts of aluminum and/or indium. In high gallium concentration embodiments, the sum of (x+y) may be less than 0.4 in some implementations, less than 0.2 in some implementations, less than 0.1 in some implementations, or even less in other implementations. In some cases, it is preferable for at least one gallium-nitride material layer to have a composition of GaN (i.e., x=y=a=b=0). For example, an active layer in which a majority of current conduction occurs may have a composition of GaN. Gallium-nitride materials in a multi-layer stack may be doped n-type or p-type, or may be undoped. Suitable gallium-nitride materials are described in U.S. Pat. No. 6,649,287, which is incorporated herein by reference in its entirety.

Figure 5B:
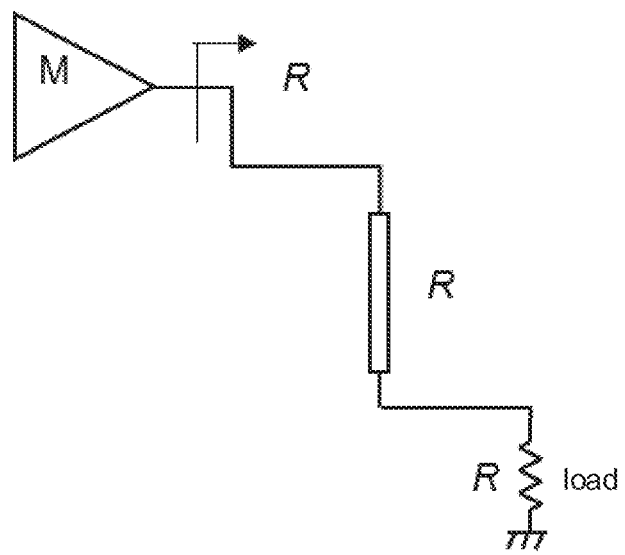
FIG. 5B depicts operation of a main amplifier in a high-efficiency, broadband, no-load-modulation power amplifier and shows an impedance value seen by the main amplifier when the peaking amplifiers are idle and not amplifying, according to some embodiments.

Impedance values seen by the plurality of amplifiers M, P1, P2, P3 can be calculated for two cases of amplifier operation: (1) fully-on (depicted in FIG. 5A), and (2) fully backed-off with the peaking amplifiers idle (depicted in FIG. 5B). The calculations are based in part on the load impedance (R for this example) and the characteristic impedances of the impedance inverters 522, 524 (R for this example). The calculations for this example consider the plurality of amplifiers M, P1, P2, P3 to be equal in power capability (e.g., they output a same amount of current when fully on). The calculations also assume that when the peaking amplifiers are idle and not amplifying, they present essentially an infinite impedance at their outputs.

Under the conditions of the preceding paragraph, in the fully-on state of the no-load-modulation power amplifier 500, the load impedance seen by the main amplifier M is calculated to be R and is represented by right-angle arrows in the drawing. In this example, the peaking amplifiers P1, P2, P3 each see the same impedance at their respective outputs. This impedance having a real value R is the same value seen when the peaking amplifiers P1, P2, P3 are idle, which can be understood from the diagram of FIG. 5B (input signal dividing circuitry and peaking amplifiers are not shown). Since the peaking amplifiers P1, P2, P3 are idle and present open circuits, they do not contribute to the output and are not shown in FIG. 5B. Accordingly, there is no load modulation for the main amplifier M in the no-load-modulation power amplifier 500 between the fully-on and fully backed-off (peaking amplifiers idle) states. In practical applications, there can be a small amount of load modulation seen by the main amplifier due to non-ideal characteristics of the components in the power amplifier. In some practical applications, a load impedance value $Z_m$ seen by a main amplifier can modulate by no more than 5% (in magnitude, for example) between the power amplifier's fully-on and fully backed-off states. In some practical applications, an impedance value $Z_m$ seen by a main amplifier can modulate by no more than 10% between the power amplifier's fully-on and fully backed-off states. In some cases, a load impedance value $Z_m$ seen by a main amplifier can modulate by no more than 20% between the power amplifier's fully-on and fully backed-off states.

Figure 6:
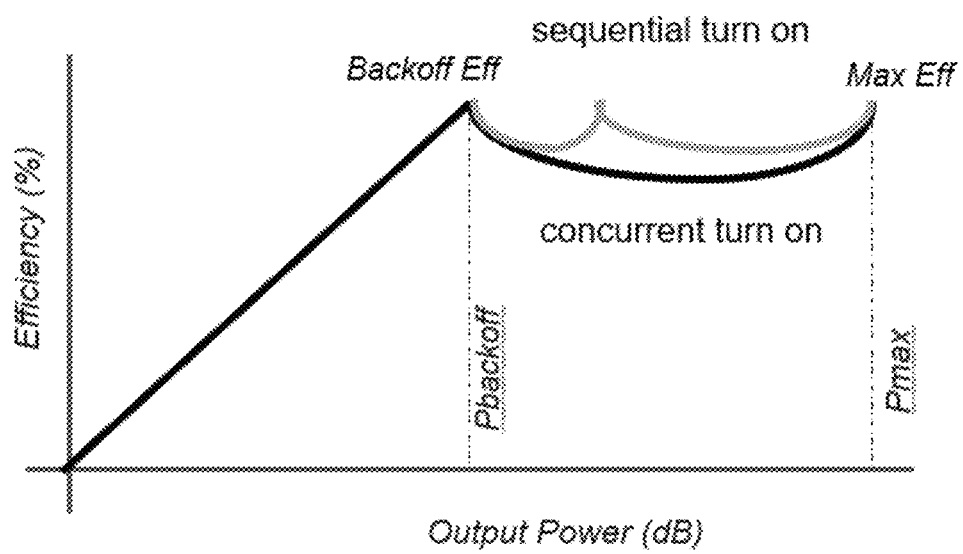
FIG. 6 illustrates efficiency curves for different configurations of a high-efficiency, broadband, no-load-modulation power amplifier, according to some embodiments.

Efficiency curves for embodiments of a no-load-modulation power amplifier 500 are illustrated in FIG. 6. The plotted efficiency curve can represent the power amplifier's drain efficiency (DE) or power-added efficiency (PAE) as a function of the amplifier's output power. Drain efficiency is defined as a ratio of RF power output from a power amplifier to the DC power input to the power amplifier. Power-added efficiency is a ratio of a net RF power output from a power amplifier (RF power out minus RF power input) to the DC power input to the power amplifier.

The location of the peak back-off efficiency ($P_{backoff}$) can depend in part upon the symmetry of the no-load-modulation power amplifier 500. A symmetric no-load-modulation power amplifier is one in which each of the amplifiers M, P1, P2, P3 have a same power-handling capability. An asymmetric no-load-modulation power amplifier is one in which two or more of the amplifiers M, P1, P2, P3 have different power-handling capabilities. For example and referring to FIG. 5A, amounts of currents Im, Ip1, Ip2, Ip3 provided by each amplifier in a fully-on state can be different. In embodiments, an asymmetric no-load-modulation power amplifier in a fully-on state can provide a maximum amount of power or current from at least one peaking amplifier that differs by more than 20% from a maximum amount of power or current from the main amplifier.

The efficiency behavior between fully-on and fully backed-off states can depend upon a turn-on configuration of the peaking amplifiers P1, P2, P3. If the peaking amplifiers are arranged to turn-on simultaneously in a same manner, then the efficiency behavior between fully-on and fully backed-off states can appear as shown by the lower black curve in FIG. 6 between the amplifier's $P_{backoff}$ and $P_{max}$ power levels. If the peaking amplifiers are configured to turn on at different levels of input signal power, then the efficiency behavior between fully-on and fully backed-off states can appear as shown by the upper gray curve in FIG. 6. Having a sequential turn-on of the peaking amplifiers can improve the overall efficiency of a no-load-modulation power amplifier 500 throughout the amplifier's back-off range.

An asymmetric no-load-modulation power amplifier 500 can be characterized by a device ratio $R_{dev}$ as follows:

$$R_{dev} = 1:r_1:r_2:r_3 \qquad (1)$$

where $r_i = Ipi/Im$ represent ratios of maximum currents Ipi (i=1, 2, 3) provided by the peaking amplifiers P1, P2, P3 to a maximum amount of current provided by the main amplifier M when the amplifiers are in a fully-on and fully-amplifying state. For an asymmetric no-load-modulation power amplifier 500, a constraint equation for the relative amounts of currents can be obtained by solving for the impedance seen by the main amplifier M in the power amplifier's 500 fully-on state. The impedance $Z_m$ seen by the main amplifier M, for a load impedance of R and impedance inverters having characteristic impedances R as illustrated in FIG. 5A, can be represented by the following expression.

$$Z_m = \frac{(1+r1)^2}{(1+r1+r2+r3)} R \qquad (2)$$

This equation can be rewritten as follows.

$$Z_m = \beta R \qquad (3)$$

To avoid or reduce load modulation, the value of β is made equal to, or approximately equal to, unity. In some cases, β can be made equal to a value between 0 and 2. For example, β can have a value other than 1 to improve performance of a power amplifier 500 by allowing some load modulation. For example, β may have a value in a range between 0.5 and 0.98 in some embodiments. Alternatively, β may have a value in a range between 1.02 and 1.5 in some embodiments. In some cases, β=1±0.2, meaning that β can be a value in a range between 0.8 and 1.2. In some cases, β=1±0.1. In some embodiments, β=1±0.05. In some cases, β=1±0.02. The symbol "±" is used herein to mean within a range of values bounded by the subsequent value.

It can also be shown that the relative location of the peak back-off efficiency ($P_{backoff}$) to the maximum power output ($P_{max}$), referred to as OBO, is given by the following equation for an asymmetric no-load-modulation power amplifier 500.

$$OBO = 10 \log\left(\frac{\beta}{\beta + r1 + r2 + r3}\right) \qquad (4)$$

When β=1, the value of OBO is determined by the relative current values r1, r2, r3. For a symmetric no-load-modulation power amplifier 500, r1≈ r2≈ r3≈ 1 and the OBO is approximately −6 dB. The table below shows OBO values and impedances seen by the amplifiers M, P1, P2, P3 for other relative current values.

TABLE 1

OBO values for asymmetric no-load-modulation power amplifier

| OBO | Zm | Zp1 | Zp2, Zp3 | r1 | r2, r3 |
|---|---|---|---|---|---|
| −8 | 50 | 33.3 | 60.1 | 1.5 | 1.8 |
| −9.5 | 50 | 25 | 66.7 | 2 | 3 |

As may be appreciated, the relative current ratios r1, r2, r3 provide design flexibility for a no-load-modulation power amplifier. For an asymmetric implementation, one of the current ratios (e.g., r1) can be selected to primarily affect the power amplifiers OBO and the remaining current ratios can be selected to suppress or eliminate load modulation of the main amplifier M. In some cases, a maximum current delivered from one of the peaking amplifiers (e.g., the second peaking amplifier) can be between 1 and 3 times a maximum amount of current delivered from the main amplifier when the main amplifier and the second peaking amplifier are fully amplifying. By selecting relative current ratios, a power amplifier can exhibit a peak in efficiency for an output power back-off (OBO) value that is between −6 dB and −10 dB. In some implementations, relative current ratios can be selected to provide a peak in efficiency for an output power back-off (OBO) value that is between −6.5 dB and −10 dB.

Figure 7:
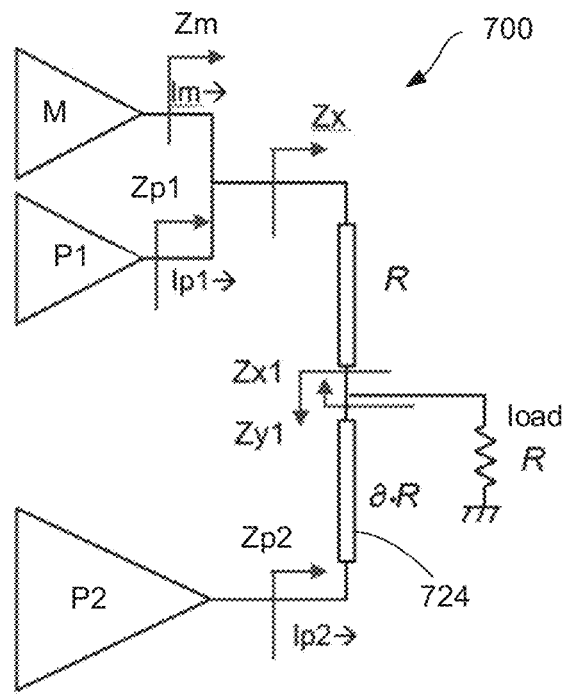
FIG. 7 depicts an alternative configuration of a high-efficiency, broadband, no-load-modulation power amplifier, according to some embodiments.

Other configurations of a no-load-modulation power amplifier are possible. FIG. 7 shows an embodiment of a no-load-modulation power amplifier 700 in which two separate peaking amplifiers P2, P3 are replaced with a single peaking amplifier P2, and one of the impedance inverters 524 is replaced with an impedance inverter 724 having a characteristic impedance $\partial R$ where $\partial$ is a value to be determined. According to some embodiments, P2 can have a power-handling capability that is about twice that of peaking amplifier P1. The no-load-modulation power amplifier 700 can be configured as a symmetric or asymmetric power amplifier. A symmetric configuration would be one in which the main amplifier M and the first peaking amplifier P1 have a same power-handling capability and the second peaking amplifier P2 has a power handling capability that is twice that of the first peaking amplifier P1. In an asymmetric configuration, the main amplifier M can have a different power-handling capability than one or both of the peaking amplifiers P1, P2.

A no-load condition for the power amplifier 700 shown in FIG. 7 can be obtained from an equation that is identical to EQ. 3 above, except that β is expressed as follows.

$$\beta = \frac{(1+r1)^2}{(1+r1+r2)} \quad (5)$$

for which r1 is a ratio (r1=Ip1/Im) of the maximum amount of current delivered by the first peaking amplifier P1 to a maximum amount of current delivered by the main amplifier M when both amplifiers are fully amplifying and r2 is a ratio (r2=Ip2/Im) of the maximum amount of current delivered by the second peaking amplifier P2 to a maximum amount of current delivered by the main amplifier M when both amplifiers are fully amplifying. Selecting values of r1 and r2 such that β=1 results in no load modulation or essentially no load modulation of the main amplifier. In some cases for the embodiment depicted in FIG. 7, β=1±0.2. In some cases, β=1±0.1. In some embodiments, β=1±0.05. In some cases, β=1±0.02. Load modulation seen by the main amplifier M for the embodiment shown in FIG. 7 can be the same as and no greater than load modulation for the main amplifier in the embodiment shown in FIG. 5A.

For asymmetric configurations of the no-load-modulation power amplifier 700 shown in FIG. 7, a value of $\partial$ can be determined by setting the impedance Zp2 seen by the second peaking amplifier to a desired value (e.g., the load impedance R or any other desired value). The impedance Zp2 can be represented by the following equation $$Zp2 = \frac{\partial^2 r2}{1+r1+r2} R \quad (6)$$

where r1 and r2 are the relative current ratios for the first and second peaking amplifiers, respectively, as described above. Setting Zp2=R gives the following expression for $\partial$.

$$\partial = \sqrt{\frac{1+r1+r2}{r2}} \quad (7)$$

The values of r1 and r2 can be selected by a designer to obtain a desired impedance Zp2 for the second peaking amplifier.

Figure 8:
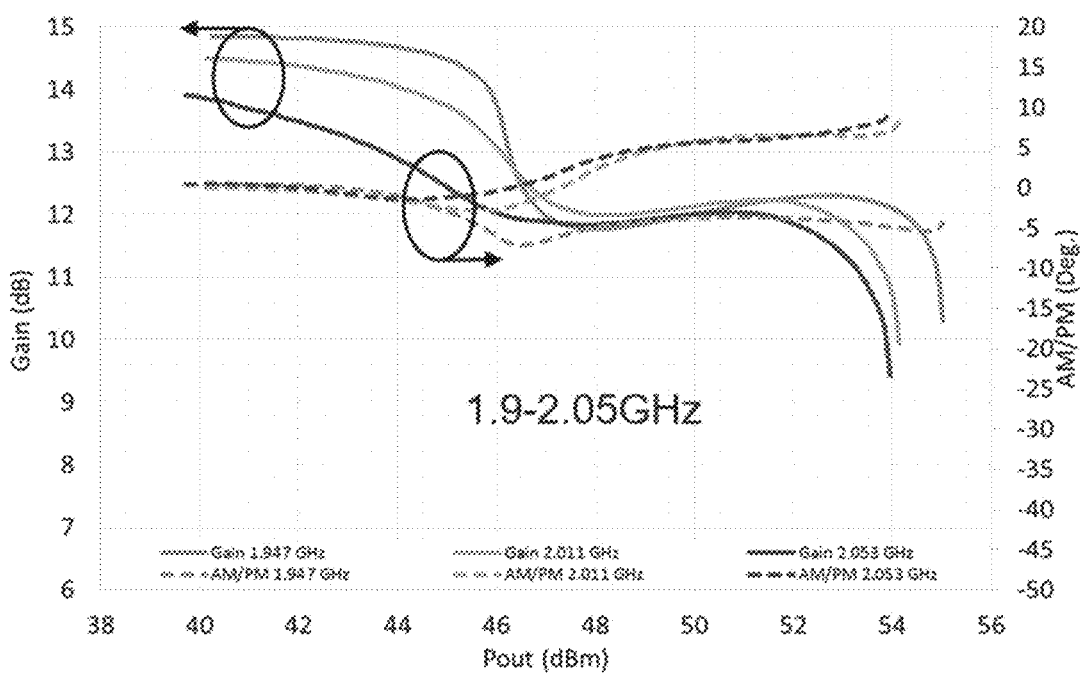
FIG. 8 graphs gain and amplitude-to-phase modulation as a function of output power for a high-efficiency, broadband, no-load-modulation power amplifier, according to some embodiments.

FIG. 8 plots gain performance and amplitude-modulation to phase-modulation (AM/PM) distortion for a symmetric no-load-modulation power amplifier 700 constructed according to the embodiment depicted in FIG. 7. The gain and AM/PM values are plotted as a function of output power for three different frequencies. The amplifier shows good gain uniformity and AM/PM performance up to about 44 dBm of output power.

Figure 9:
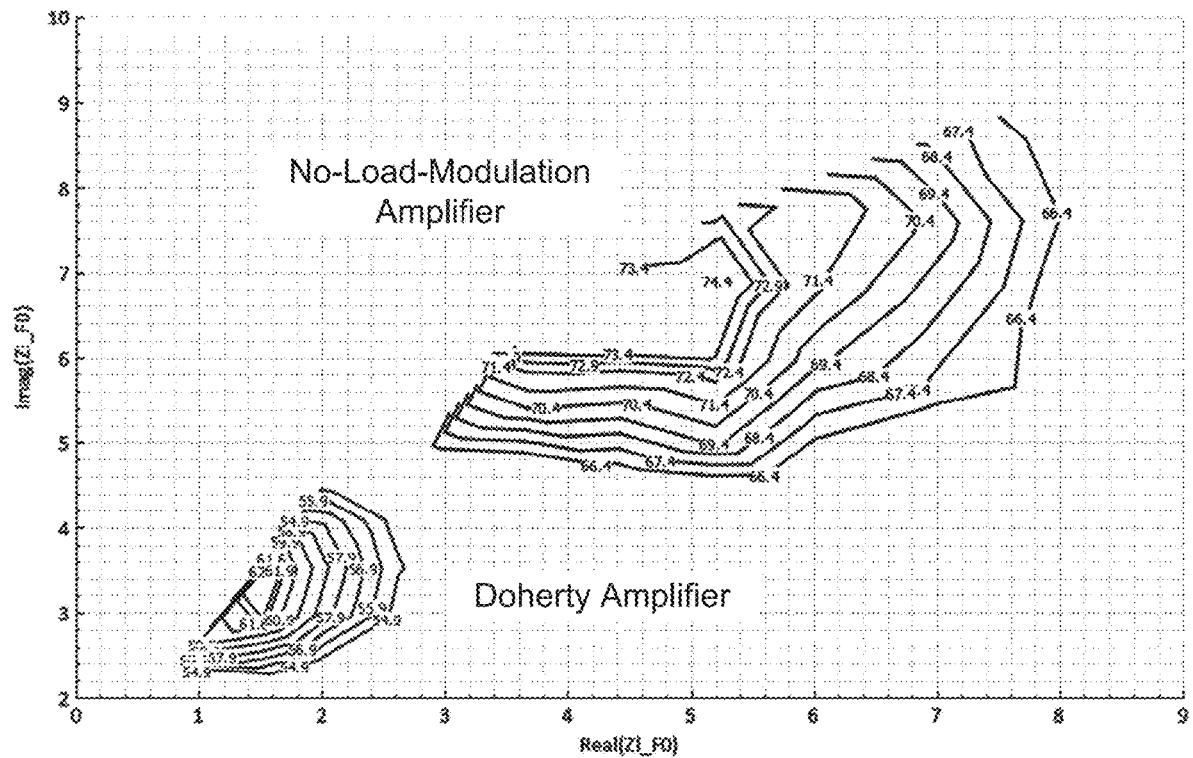
FIG. 9 compares load impedance capability and drain efficiency of a high-efficiency, broadband, no-load-modulation power amplifier and a Doherty amplifier, according to some embodiments.

FIG. 9 plots comparisons of amplifier output impedance and drain efficiency between a no-load-modulation power amplifier 700 and a conventional Doherty amplifier designed for a same power specification. Drain efficiency (DE) values are plotted as contours (DE values listed on the contours) and indicate which impedance values yield the plotted DE. The no-load-modulation power amplifier 700 shows about a 10% increase in drain efficiency for load impedances that are up to three times higher than load impedances that can be handled by the Doherty amplifier. Both amplifiers were configured to output a same amount of maximum power, and the plots of drain efficiency were generated for output power values of 47.5 dBm. The Doherty amplifier was operated at 1.88 GHz and the no-load-modulation amplifier was operated at 1.90 GHz. It should also be noted that the power-handling requirement for the main and first peaking amplifiers are each about one-half of the power-handling requirement of a Doherty's main amplifier for a same overall power amplifier specification, since there are two amplifiers (M, P1) in the no-load-modulation power amplifier that are handling the power of a single main amplifier in the Doherty in fully-on states.

Figure 10:
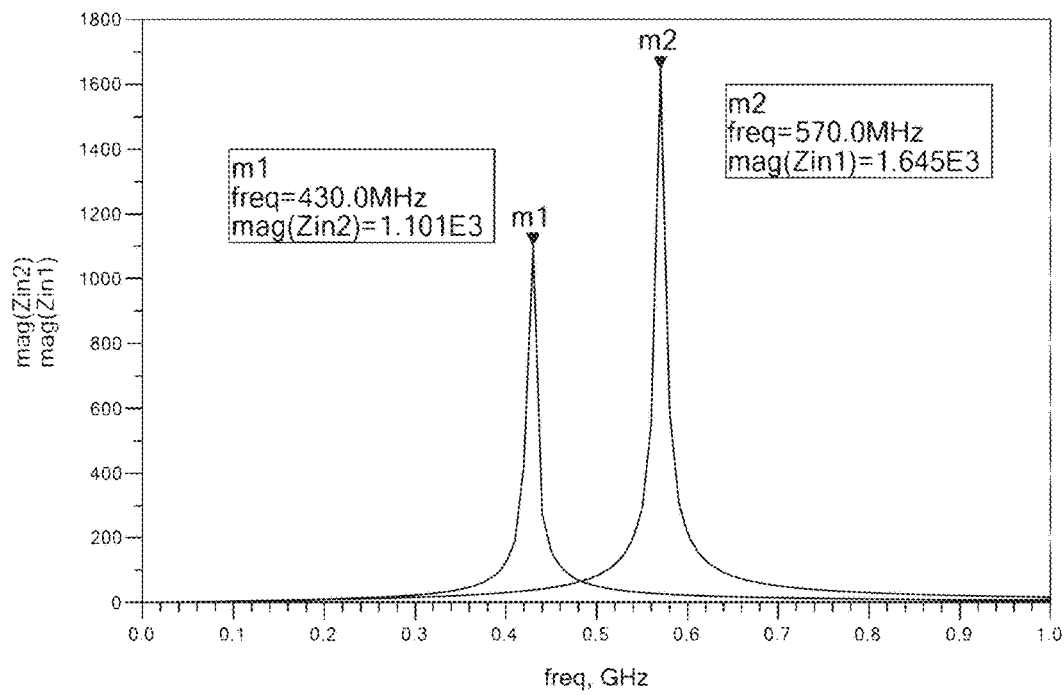
FIG. 10 compares video bandwidth capability of a high-efficiency, broadband, no-load-modulation power amplifier and a Doherty amplifier, according to some embodiments.

FIG. 10 plots comparisons of input impedance values as a function of baseband frequency between a no-load-modulation power amplifier 700 and a conventional Doherty amplifier. The plotted curves reflect simulated resonance characteristics of the inputs at baseband frequencies. These resonances are determined primarily by a parallel LC circuit that comprises inductances L connected between the gates of the main amplifier and a biasing node, for example, and drain-to-source capacitances of the main amplifier. Typically, the resonances occur at a frequency value that is about twice a video bandwidth (also referred to as instantaneous bandwidth) of the entire power amplifier system. These results show an improvement in video bandwidth of about 32% for a no-load-modulation power amplifier. The results of FIG. 10 suggest that a video bandwidth for a no-load-modulation power amplifier can be about 285 MHz, which represents a significant improvement over the Doherty embodiment (a video bandwidth of about 215 MHz).

Figure 11:
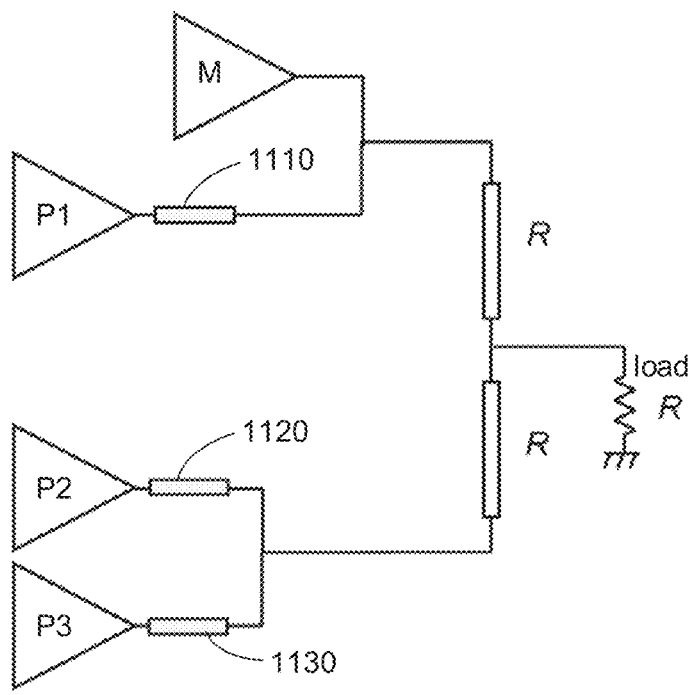
FIG. 11 depicts an embodiment of a high-efficiency, broadband, no-load-modulation power amplifier that includes impedance-matching components within the amplifier circuitry, according to some embodiments.

Referring again to Table 1 and FIG. 5A, an asymmetric version of a no-load-modulation power amplifier 500 can be constructed in which different amplifiers handle different amounts of power. According to Table 1, impedances seen by the different amplifiers P1, P2, P3 at their outputs can have different values. Variations in impedances seen by the peaking amplifiers can be undesirable since the amplifiers may be constructed to drive a typical load impedance (e.g., 50 ohms). In some embodiments, impedance transformers 1110, 1120, 1130 can be connected to outputs of the peaking amplifiers, as shown in FIG. 11, to transform a downstream impedance (listed in Table 1) to a desired impedance (e.g., 50 ohms). Impedance transformers can also be connected to outputs of the peaking amplifiers for the embodiment shown in FIG. 7.

Figure 12:
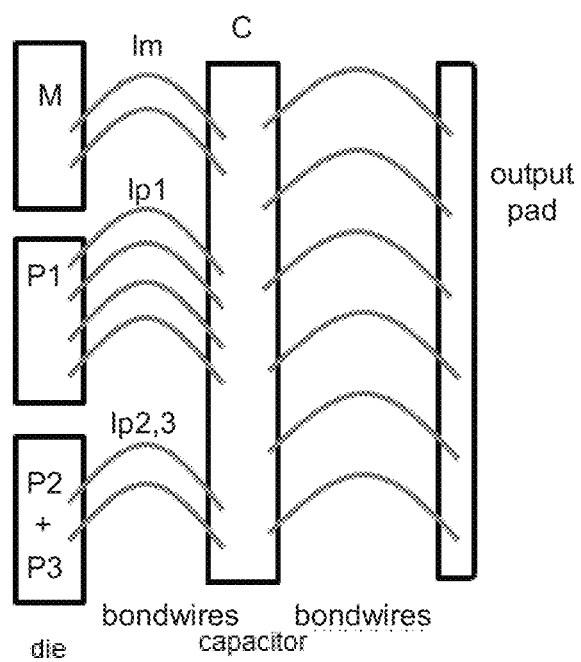
FIG. 12 illustrates structure that can be used to construct a high-efficiency, broadband, no-load-modulation power amplifier on a circuit board or monolithic microwave integrated circuit (MMIC), according to some embodiments.

FIG. 12 depicts an embodiment of amplifier die and an output network for a no-load-modulation power amplifier that can be implemented on a circuit board or MMIC, for example. The depicted embodiment can be applied to a four-amplifier, no-load modulation power amplifier depicted in FIG. 5A as well as a three-amplifier, no-load modulation power amplifier depicted in FIG. 7. For example, the main amplifier M and peaking amplifiers P1, P2 and P3 can be attached to a circuit board or MMIC (not shown) and have output pads that connect to a first electrode of a capacitor C (e.g., a bar capacitor) via bond wires 1210. The capacitor can connect between the bond wires and a reference potential, such as ground. Additional bond wires can connect between the capacitor's first electrode and an output pad. In such an embodiment, an electrode of the capacitor C can serve as a combining node 155 of the power amplifier.

For the embodiment shown in FIG. 12, drain-to-source capacitances ($C_{ds}$) of the individual amplifiers can be used as part of a network that includes the bond wires 1210 and capacitor C. The resulting networks can form the impedance inverters (e.g., inverters 522, 524 referring to FIG. 5A) that are located between the amplifiers' outputs and the combining node. For example, the drain-to-source capacitances of the main amplifier die M and first peaking amplifier die P1, bond wires $L_m$ and $L_{p1}$, and capacitor C can form a first impedance inverter. In this manner, the power amplifier can be assembled as a compact package.

Figure 13:
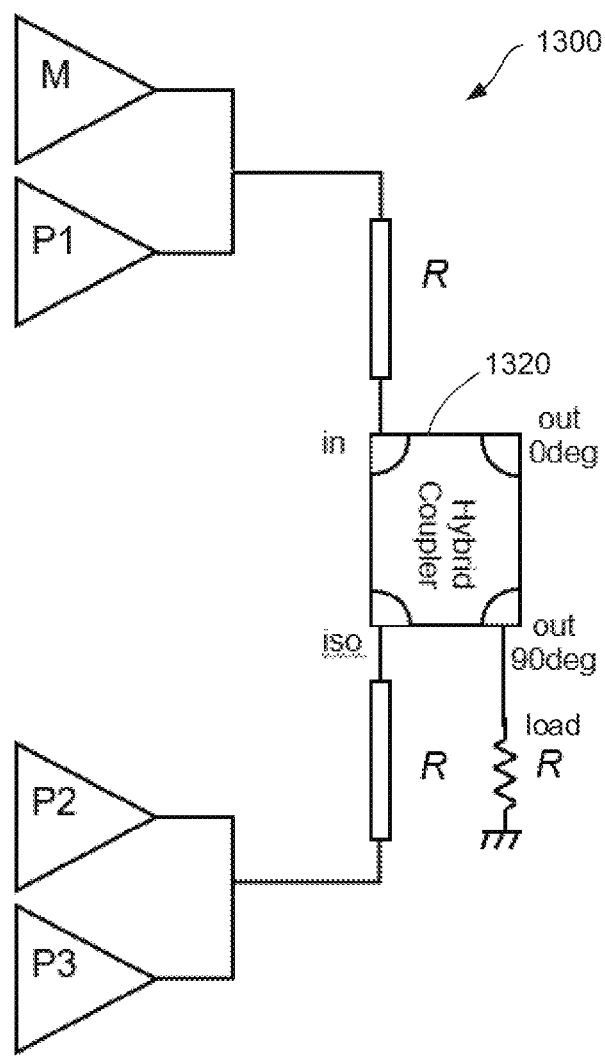
FIG. 13 depicts a high-efficiency, broadband, no-load-modulation power amplifier in which a hybrid coupler is used to combine signals from the main and peaking amplifiers, according to some embodiments.
Figure 14:
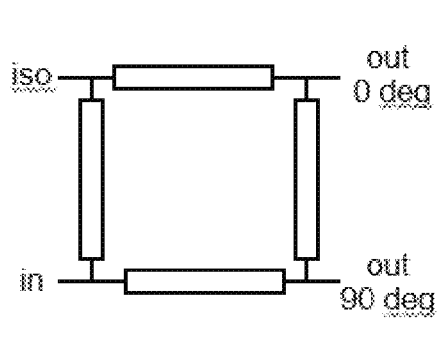
FIG. 14 depicts an embodiment of a hybrid coupler.
Figure 15:
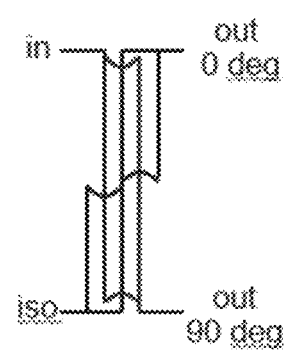
FIG. 15 depicts another embodiment of a hybrid coupler.

FIG. 13 illustrates an embodiment of a no-load-modulation power amplifier 1300 in which a hybrid coupler 1320 is used to combine outputs from the amplifiers M, P1, P2, P3 rather than a conventional T junction, for example. The inventors have recognized and appreciated that a hybrid coupler can further significantly improve bandwidth characteristics of a no-load-modulation power amplifier. Examples of hybrid couplers that can be used include, but are not limited to, Lange couplers, a branch line coupler depicted in FIG. 14, and a quadrature line coupler depicted in FIG. 15. Either of these couplers can be discrete devices that are added to a circuit board or MMIC, or can be printed and fabricated on and as part of an integrated circuit on a circuit board or MMIC. The inventors have also recognized that hybrid couplers such as these can be used to improve bandwidth performance in other power amplifier configurations where signals from two or more amplifiers operating in parallel are combined, such as Doherty amplifiers.

A hybrid coupler can offer a smaller size compared to a T junction, particularly at lower frequencies. A hybrid coupler can also provide better isolation of the peaking amplifiers from the main amplifier when they are in idle states. Better isolation can reduce signal loss and power loss at amplifier back-off. In some implementations, a hybrid coupler can suppress the amount of intermodulation products that would otherwise bypass a T-junction type combiner.

Figure 16:
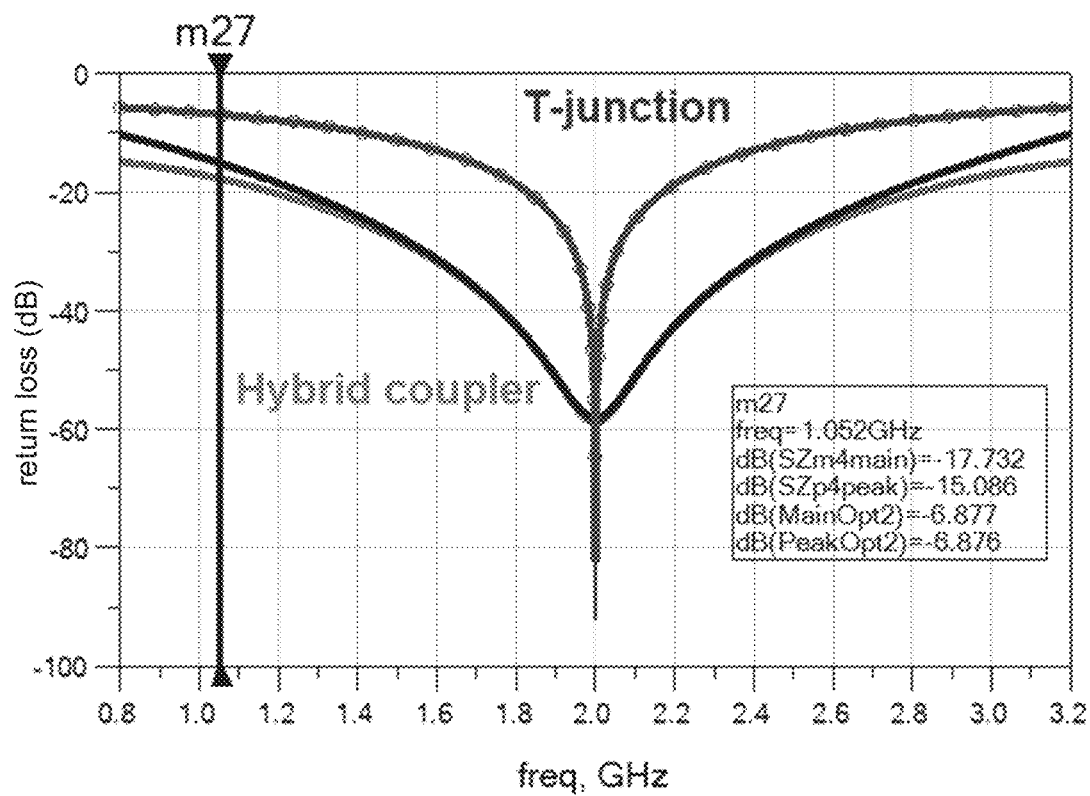
FIG. 16 plots return losses of main and peaking amplifiers for two no-load-modulation power amplifiers, one using a conventional T-junction combiner and one using a hybrid coupler.

Simulations with hybrid couplers indicate improvements in RF fractional bandwidth at the carrier frequency by 25% or more depending upon the power amplifier design. Fractional bandwidth can be represented symbolically as $\Delta\omega/\omega_o$, and represents a bandwidth between the −20 dB return loss points for a device relative to the carrier frequency $\omega_o$ applied to the device. Results from example simulations are shown in FIG. 16. In this example, the carrier frequency is 2 GHz. The traces compare return losses for the main amplifier for two combiners: a conventional T-junction combiner (upper dashed trace) and a quadrature line hybrid coupler (lower solid trace). The simulations were each for a four-amplifier, no-load-modulation power amplifier of the present embodiments like that depicted in FIG. 5A. The plot indicates a significant increase in RF fractional bandwidth for the hybrid coupler. For this simulation, the RF fractional bandwidth for the T-junction combiner is about 17%. The RF fractional bandwidth for the same power amplifier is about 73% when a hybrid coupler is used to combine signals from the amplifiers.

Methods of operating a no-load-modulation power amplifier are also contemplated by the inventors. A method can comprise dividing a signal into a plurality of signals, and providing the divided signal portions to multiple amplifiers connected in parallel. One of the amplifiers can be operated as a main amplifier in a first amplifier class (e.g., class AB). The remaining amplifiers can be operated as peaking amplifiers in a second amplifier class (e.g., class C). Outputs from a first portion of the amplifiers can be combined and provided to a first impedance inverter, and outputs from a second portion of the amplifiers can be combined and provided to a second impedance inverter. Outputs from the impedance inverters can be combined and provided to an output port, which can be connected to a load having an impedance R. Characteristic impedances of the impedance inverters and relative current ratios of the peaking amplifiers can be determined as described above to provide a power amplifier in which the main amplifier sees little or no load modulation between the power amplifier's fully-on state and fully backed-off state. In some embodiments, the main amplifier sees less than 20% modulation of its load between the power amplifier's fully-on state and fully backed-off state. In some cases, the main amplifier sees less than 5% modulation of its load between the power amplifier's fully-on state and fully backed-off state.

Power amplifiers described herein can be embodied in various configurations. Example configurations include combinations of configurations (1) through (16) as described below.

(1) A power amplifier comprising: a main amplifier connected in parallel with a first peaking amplifier in a first circuit branch; and a second peaking amplifier connected in parallel with a third peaking amplifier in a second circuit branch that is in parallel with the first circuit branch, wherein the main amplifier is configured to operate in a first amplifier class and the peaking amplifiers are configured to operate in an amplifier class that is different from the first amplifier class, wherein a load impedance seen by the main amplifier is approximately a same value when the peaking amplifiers are fully amplifying received signals and when the peaking amplifiers are not amplifying received signals.

(2) The power amplifier of configuration (1), further comprising: a combining node at which the first circuit branch connects to the second circuit branch; an output port of the power amplifier connected to the combining node and configured to connect to a load having an impedance value R; a first impedance inverter in the first circuit branch having a characteristic impedance value of R±0.05R; and a second impedance inverter in the second circuit branch having a characteristic impedance value of R±0.05R, wherein the power amplifier is adapted to drive the load having the impedance value R.

(3) The power amplifier of configuration (1) or (2), wherein a load impedance seen by the main amplifier is approximately R when the peaking amplifiers are fully amplifying received signals and when the peaking amplifiers are not amplifying received signals.

(4) The power amplifier of any one of configurations (1) through (3), wherein the value of R has a real impedance value between 10 ohms and 100 ohms.

(5) The power amplifier of any one of configurations (1) through (4), further comprising a first impedance transformer connected between the first peaking amplifier and the first impedance inverter.

(6) The power amplifier of any one of configurations (1) through (5), wherein the combining node comprises an electrode of a capacitor.

(7) The power amplifier of any one of configurations (1) through (6), wherein the main amplifier, first peaking amplifier, second peaking amplifier, and third peaking amplifier are formed from gallium-nitride material.

(8) The power amplifier of any one of configurations (1) through (7), further comprising a plurality of bond wires connecting outputs from the main amplifier, first peaking amplifier, second peaking amplifier, and third peaking amplifier to a same electrode of a capacitor.

(9) The power amplifier of configuration (8), wherein a portion of the plurality of bond wires, drain-to-source capacitances of the main amplifier and first peaking amplifier, and the capacitor form an impedance inverter.

(10) The power amplifier of any one of configurations (1) through (9), assembled in a microwave monolithic integrated circuit or assembled on a circuit board.

(11) The power amplifier of any one of configurations (1) through (10), wherein the main amplifier, first peaking amplifier, second peaking amplifier, and third peaking amplifier each comprise at least one high electron-mobility transistor.

(12) The power amplifier of any one of configurations (1) through (11), wherein a maximum amount of output current from one of the peaking amplifiers differs by more than 20% from a maximum amount of current from the main amplifier.

(13) The power amplifier of any one of configurations (1) through (12), further comprising signal dividing circuitry that divides a received input signal into four output signals that are provided to the main amplifier and peaking amplifiers, wherein at least one of the four output signals provided to a peaking amplifier is delayed in phase by an amount between 80 degrees and 100 degrees with respect to a phase of an output signal provided to the main amplifier.

(14) The power amplifier of any one of configurations (1) through (13), wherein the power amplifier exhibits a peak in efficiency for an output power back-off value that is between −10 dB and −6.5 dB.

(15) The power amplifier of any one of configurations (1) through (14), wherein a maximum current delivered from the second peaking amplifier is between 1 and 3 times a maximum amount of current delivered from the main amplifier when the main amplifier and the second peaking amplifier are fully amplifying.

(16) The power amplifier of any one of configurations (1) through (15), wherein current ratios r1, r2, and r3 for the peaking amplifiers satisfy the following relation $$\frac{(1+r1)^2}{(1+r1+r2+r3)} = 1 \pm 0.2$$

where r1 is a ratio of a maximum amount of current delivered by the first peaking amplifier to a maximum amount of current delivered by the main amplifier when main amplifier and first peaking amplifier are fully amplifying, r2 is a ratio of a maximum amount of current delivered by the second peaking amplifier to a maximum amount of current delivered by the main amplifier when the main amplifier and the second peaking amplifier are fully amplifying, and r3 is a ratio of a maximum amount of current delivered by the third peaking amplifier to a maximum amount of current delivered by the main amplifier when the main amplifier and third peaking amplifier are fully amplifying.

Methods of operating power amplifiers of the foregoing configurations include different combinations of acts as described in methods (17) through (28) below.

(17) A method of operating a power amplifier comprising: at a first time: in a first circuit branch of the power amplifier, amplifying a first portion of a first received signal with a main amplifier that is connected in parallel with a first peaking amplifier that is not amplifying; at a second time: amplifying a first portion of a second received signal with the main amplifier; amplifying a second portion of the second received signal with the first peaking amplifier in a fully-on state; amplifying a third portion of the second received signal with a second peaking amplifier in a fully-on state; and amplifying a forth portion of the second received signal with a third peaking amplifier in a fully-on state that is connected in parallel with the second peaking amplifier in a second circuit branch of the power amplifier, wherein a load impedance seen by the main amplifier at the first time is approximately a same value to a load impedance seen by the main amplifier at the second time.

(18) The method of (17), further comprising: providing signals from the main amplifier and the first peaking amplifier to a first impedance inverter in the first circuit branch having a characteristic impedance value of R±0.05R; providing signals from the second peaking amplifier and the third peaking amplifier to a second impedance inverter in the second circuit branch having a characteristic impedance value of R±0.05R; combining signals from the first circuit branch and the second circuit branch at a combining node; and providing a combined signal from the combining node to an output port of the power amplifier that is configured to connect to a load having an impedance value R.

(19) The method of (17) or (18), wherein a load impedance seen by the main amplifier is approximately R when the peaking amplifiers are fully amplifying at the second time and when the peaking amplifiers are not amplifying at the first time.

(20) The method of any one of (17) through (19), wherein the value of R has a real impedance value between 10 ohms and 100 ohms.

(21) The method of any one of (17) through (20), further comprising providing a signal output from the first peaking amplifier to a first impedance transformer connected between the first peaking amplifier and the first impedance inverter.

(22) The method of any one of (17) through (21), wherein the combining node comprises an electrode of a capacitor.

(23) The method of any one of (17) through (22), wherein the main amplifier, first peaking amplifier, second peaking amplifier, and third peaking amplifier are formed from gallium-nitride material.

(24) The method of any one of (17) through (23), wherein the main amplifier, first peaking amplifier, second peaking amplifier, and third peaking amplifier each comprise at least one high electron-mobility transistor.

(25) The method of any one of (17) through (24), wherein a maximum amount of output current from one of the peaking amplifiers differs by more than 20% from a maximum amount of current from the main amplifier.

(26) The method of any one of (17) through (25), further comprising:
dividing the second received signal into four output signals that are provided to the main amplifier and peaking amplifiers; and
delaying the phase of at least one of the four output signals provided to a peaking amplifier by an amount between 80 degrees and 100 degrees with respect to a phase of an output signal provided to the main amplifier.

(27) The method of any one of (17) through (26), wherein the power amplifier exhibits a peak in efficiency for an output power back-off value that is between −10 dB and −6.5 dB.

(28) The method of any one of (17) through (27), further comprising delivering a maximum current from the second peaking amplifier that is between 1 and 3 times a maximum amount of current delivered from the main amplifier when the main amplifier and the second peaking amplifier are fully amplifying.

Further embodiments include configurations (29) through (44) below.

(29) A power amplifier comprising: a main amplifier connected in parallel with a first peaking amplifier in a first circuit branch; and a second peaking amplifier in a second circuit branch that is in parallel with the first circuit branch, wherein the main amplifier is configured to operate in a first amplifier class and the first and second peaking amplifiers are configured to operate in an amplifier class that is different from the first amplifier class, wherein a load impedance seen by the main amplifier is approximately a same value when the peaking amplifiers are fully amplifying received signals and when the peaking amplifiers are not amplifying received signals.

(30) The power amplifier of configuration (29), further comprising: a combining node at which the first circuit branch connects to the second circuit branch; an output port of the power amplifier connected to the combining node and configured to connect to a load having an impedance value R; a first impedance inverter in the first circuit branch having a characteristic impedance value of R±0.05R; and a second impedance inverter in the second circuit branch having a characteristic impedance value of $\partial$R±0.05R, wherein the power amplifier is adapted to drive the load having the impedance value R and wherein $\partial$ is given by the following expression $$\partial = \sqrt{\frac{1 + r1 + r2}{r2}}$$

where r1 is a ratio of maximum current delivered by the first peaking amplifier when fully amplifying to a maximum current delivered by the main amplifier when fully amplifying and r2 is a ratio of maximum current delivered by the second peaking amplifier when fully amplifying to a maximum current delivered by the main amplifier when fully amplifying.

(31) The power amplifier of configuration (29) or (30), wherein a load impedance seen by the main amplifier is approximately R when the peaking amplifiers are fully amplifying received signals and when the peaking amplifiers are not amplifying received signals.

(32) The power amplifier of any one of configurations (29) through (31), wherein the value of R has a real impedance value between 10 ohms and 100 ohms.

(33) The power amplifier of any one of configurations (29) through (32), further comprising a first impedance transformer connected between the first peaking amplifier and the first impedance inverter.

(34) The power amplifier of any one of configurations (29) through (33), wherein the combining node comprises an electrode of a capacitor.

(35) The power amplifier of any one of configurations (29) through (34), wherein the main amplifier, first peaking amplifier, and second peaking amplifier are formed from gallium-nitride material.

(36) The power amplifier of any one of configurations (29) through (35), further comprising a plurality of bond wires connecting outputs from the main amplifier, first peaking amplifier, and second peaking amplifier to a same electrode of a capacitor.

(37) The power amplifier of configuration (36), wherein a portion of the plurality of bond wires, drain-to-source capacitances of the main amplifier and first peaking amplifier, and the capacitor form an impedance inverter.

(38) The power amplifier of any one of configurations (29) through (37), assembled in a microwave monolithic integrated circuit or assembled on a circuit board.

(39) The power amplifier of any one of configurations (29) through (38), wherein the main amplifier, first peaking amplifier, and second peaking amplifier each comprise at least one high electron-mobility transistor.

(40) The power amplifier of any one of configurations (29) through (39), wherein a maximum amount of output current from one of the peaking amplifiers differs by more than 20% from a maximum amount of current from the main amplifier.

(41) The power amplifier of any one of configurations (29) through (40), further comprising signal dividing circuitry that divides a received input signal into three output signals that are provided to the main amplifier and peaking amplifiers, wherein at least one of the three output signals provided to a peaking amplifier is delayed in phase by an amount between 80 degrees and 100 degrees with respect to a phase of an output signal provided to the main amplifier.

(42) The power amplifier of any one of configurations (29) through (41), wherein the power amplifier exhibits a peak in efficiency for an output power back-off value that is between −10 dB and −6.5 dB.

(43) The power amplifier of any one of configurations (29) through (42), wherein a maximum current delivered from the second peaking amplifier is between 1 and 3 times a maximum amount of current delivered from the main amplifier when the main amplifier and the second peaking amplifier are fully amplifying.

(44) The power amplifier of any one of configurations (29) through (43), wherein current ratios r1 and r2 for the peaking amplifiers satisfy the following relation $$\frac{(1 + r1)^2}{(1 + r1 + r2)} = 1 \pm 0.2$$

where r1 is a ratio of a maximum amount of current delivered by the first peaking amplifier to a maximum amount of current delivered by the main amplifier when main amplifier and first peaking amplifier are fully amplifying and r2 is a ratio of a maximum amount of current delivered by the second peaking amplifier to a maximum amount of current delivered by the main amplifier when the main amplifier and the second peaking amplifier are fully amplifying.

Methods of operating power amplifiers of configurations (29) through (44) include different combinations of acts as described in methods (45) through (56) below.

(45) A method of operating a power amplifier comprising: at a first time: in a first circuit branch of the power amplifier, amplifying a first portion of a first received signal with a main amplifier that is connected in parallel with a first peaking amplifier that is not amplifying; at a second time: amplifying a first portion of a second received signal with the main amplifier; amplifying a second portion of the second received signal with the first peaking amplifier in a fully-on state; and amplifying a third portion of the second received signal with a second peaking amplifier in a fully-on state that is connected in parallel with the first circuit branch of the power amplifier, wherein a load impedance seen by the main amplifier at the first time is approximately a same value to a load impedance seen by the main amplifier at the second time.

(46) The method of (45), further comprising: providing signals from the main amplifier and the first peaking amplifier to a first impedance inverter in the first circuit branch having a characteristic impedance value of R±0.05R; providing signals from the second peaking amplifier to a second impedance inverter having a characteristic impedance value of ∂R±0.05R, wherein ∂ is given by the following expression $$\partial = \sqrt{\frac{1+r1+r2}{r2}}$$

where r1 is a ratio of maximum current delivered by the first peaking amplifier when fully amplifying to a maximum current delivered by the main amplifier when fully amplifying and r2 is a ratio of maximum current delivered by the second peaking amplifier when fully amplifying to a maximum current delivered by the main amplifier when fully amplifying; combining signals from the first circuit branch and the second impedance inverter at a combining node; and providing a combined signal from the combining node to an output port of the power amplifier that is configured to connect to a load having an impedance value R.

(47) The method of (45) or (46), wherein a load impedance seen by the main amplifier is approximately R when the peaking amplifiers are fully amplifying at the second time and when the peaking amplifiers are not amplifying at the first time.

(48) The method of any one of (45) through (47), wherein the value of R has a real impedance value between 10 ohms and 100 ohms.

(49) The method of any one of (45) through (48), further comprising providing a signal output from the first peaking amplifier to a first impedance transformer connected between the first peaking amplifier and the first impedance inverter.

(50) The method of any one of (45) through (49), wherein the combining node comprises an electrode of a capacitor.

(51) The method of any one of (45) through (50), wherein the main amplifier, first peaking amplifier, and second peaking amplifier are formed from gallium-nitride material.

(52) The method of any one of (45) through (51), wherein the main amplifier, first peaking amplifier, and second peaking amplifier each comprise at least one high electron-mobility transistor.

(53) The method of any one of (45) through (52), wherein a maximum amount of output current from one of the peaking amplifiers differs by more than 20% from a maximum amount of current from the main amplifier.

(54) The method of any one of (45) through (53), further comprising: dividing the second received signal into three output signals that are provided to the main amplifier and peaking amplifiers; and delaying the phase of at least one of the three output signals provided to a peaking amplifier by an amount between 80 degrees and 100 degrees with respect to a phase of an output signal provided to the main amplifier.

(55) The method of any one of (45) through (54), wherein the power amplifier exhibits a peak in efficiency for an output power back-off value that is between −10 dB and −6.5 dB.

(56) The method of any one of (45) through (55), further comprising delivering a maximum current from the second peaking amplifier that is between 1 and 3 times a maximum amount of current delivered from the main amplifier when the main amplifier and the second peaking amplifier are fully amplifying.

Further embodiments of power amplifiers include configurations (57) through (67) described below.

(57) A power amplifier comprising: a main amplifier connected in a first circuit branch; a first peaking amplifier in a second circuit branch that is in parallel with the first circuit branch, wherein the main amplifier is configured to operate in a first amplifier class and the first peaking amplifier is configured to operate in an amplifier class that is different from the first amplifier class; and a hybrid coupler arranged to combine a first signal from the first circuit branch with a second signal from the second circuit branch.

(58) The power amplifier of configuration (57), wherein the hybrid coupler is a branch line coupler or a quadrature line coupler.

(59) The power amplifier of configuration (57), wherein the hybrid coupler is a Lange coupler.

(60) The power amplifier of any one of configurations (57) through (59), further comprising a second peaking amplifier connected in parallel with the main amplifier in the first circuit branch, wherein a load impedance seen by the main amplifier is approximately a same value when the peaking amplifiers are fully amplifying received signals and when the peaking amplifiers are not amplifying received signals.

(61) The power amplifier of any one of configurations (57) through (60), further comprising: an output port of the power amplifier connected to the hybrid coupler and configured to connect to a load having an impedance value R; a first impedance inverter in the first circuit branch having a characteristic impedance value of R±0.05R; and a second impedance inverter in the second circuit branch having a characteristic impedance value of ∂R±0.05R, wherein the power amplifier is adapted to drive the load having the impedance value R and wherein ∂ is given by the following expression $$\partial = \sqrt{\frac{1+r1+r2}{r2}}$$

where r1 is a ratio of maximum current delivered by the first peaking amplifier when fully amplifying to a maximum current delivered by the main amplifier when fully amplifying and r2 is a ratio of maximum current delivered by the second peaking amplifier when fully amplifying to a maximum current delivered by the main amplifier when fully amplifying.

(62) The power amplifier of any one of configurations (57) through (61), wherein a load impedance seen by the main amplifier is approximately R when the peaking amplifiers are fully amplifying received signals and when the peaking amplifiers are not amplifying received signals.

(63) The power amplifier of any one of configurations (57) through (62), wherein the value of R has a real impedance value between 10 ohms and 100 ohms.

(64) The power amplifier of any one of configurations (57) through (59), further comprising: a second peaking amplifier connected in parallel with the main amplifier in the first circuit branch; and a third peaking amplifier connected in parallel with the first peaking amplifier in the second circuit branch wherein a load impedance seen by the main amplifier is approximately a same value when the peaking amplifiers are fully amplifying received signals and when the peaking amplifiers are not amplifying received signals.

(65) The power amplifier of configuration (64), further comprising: an output port of the power amplifier connected to the hybrid coupler and configured to connect to a load having an impedance value R; a first impedance inverter in the first circuit branch having a characteristic impedance value of R±0.05R; and a second impedance inverter in the second circuit branch having a characteristic impedance value of R±0.05R, wherein the power amplifier is adapted to drive the load having the impedance value R.

(66) The power amplifier of any one of configurations (57) through (59), (64), and (65), wherein a load impedance seen by the main amplifier is approximately R when the peaking amplifiers are fully amplifying received signals and when the peaking amplifiers are not amplifying received signals.

(67) The power amplifier of any one of configurations (57) through (59) and (64) through (66), wherein the value of R has a real impedance value between 10 ohms and 100 ohms.

Methods of operating power amplifiers of configurations (57) through (67) include methods (68) through (72) described below.

(68) A method of operating a power amplifier comprising: at a first time: in a first circuit branch of the power amplifier, amplifying a first portion of a first received signal with a main amplifier; at a second time: amplifying a first portion of a second received signal with the main amplifier; and amplifying a second portion of the second received signal with a first peaking amplifier in a fully-on state in a second circuit branch of the power amplifier that is in parallel to the first circuit branch; and combining a signal from the first circuit branch with a signal from the second circuit branch with a hybrid coupler.

(69) The method of (68), wherein the hybrid coupler is a branch line coupler or a quadrature line coupler.

(70) The method of (68), wherein the hybrid coupler is a Lange coupler.

(71) The method of any one of (68) through (70), further comprising at the second time, amplifying a third portion of the second received signal with a second peaking amplifier in a fully-on state that is connected in parallel with the main amplifier, wherein a load impedance seen by the main amplifier is approximately the same at the first time and the second time.

(72) The method of any one of (68) through (70), further comprising at the second time: amplifying a third portion of the second received signal with a second peaking amplifier in a fully-on state that is connected in parallel with the main amplifier; and amplifying a fourth portion of the second received signal with a third peaking amplifier in a fully-on state that is connected in parallel with the first peaking amplifier, wherein a load impedance seen by the main amplifier is approximately the same at the first time and the second time.

CONCLUSION

The terms "approximately" and "about" may be used to mean within +20% of a target value in some embodiments, within +10% of a target value in some embodiments, within +5% of a target value in some embodiments, and yet within +2% of a target value in some embodiments. The terms "approximately" and "about" may include the target value. The term "essentially" is used to mean within +3% of and including a target value.

The technology described herein may be embodied as a method, of which at least some acts have been described. The acts performed as part of the method may be ordered in any suitable way. Accordingly, embodiments may be constructed in which acts are performed in an order different than described, which may include performing some acts simultaneously, even though described as sequential acts in illustrative embodiments. Additionally, a method may include more acts than those described, in some embodiments, and fewer acts than those described in other embodiments.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A power amplifier comprising:
a main amplifier connected in parallel with a first peaking amplifier in a first circuit branch;
a second peaking amplifier connected in parallel with a third peaking amplifier in a second circuit branch that is in parallel with the first circuit branch; and
a first impedance inverter in the first circuit branch and a second impedance inverter in the second circuit branch, wherein:
current ratios for the peaking amplifiers with respect to the main amplifier set a load impedance seen by the main amplifier to approximately a same value when the peaking amplifiers are fully amplifying received signals and when the peaking amplifiers are not amplifying received signals.

2. The power amplifier of claim 1, further comprising:
an output port of the power amplifier configured to connect to a load having an impedance value R, wherein:
The first impedance inverter has a characteristic impedance value of R±0.05R; and the second impedance inverter has a characteristic impedance value of R±0.05R.

3. The power amplifier of claim 1, wherein a load impedance seen by the main amplifier is approximately R when the peaking amplifiers are fully amplifying received signals and when the peaking amplifiers are not amplifying received signals.

4. The power amplifier of claim 1, further comprising:
a first impedance transformer connected between the first peaking amplifier and the first impedance inverter;
a second impedance transformer connected between the second peaking amplifier and the second impedance inverter; and
a third impedance transformer connected between the third peaking amplifier and the second impedance inverter.

5. The power amplifier of claim 1, further comprising a combining node at which the first circuit branch connects to the second circuit branch, wherein the combining node comprises an electrode of a capacitor.

6. The power amplifier of claim 5, further comprising a plurality of bond wires connecting outputs from the main amplifier, the first peaking amplifier, the second peaking amplifier, and the third peaking amplifier to the electrode of the capacitor.

7. The power amplifier of claim 1, further comprising a hybrid coupler, wherein the first circuit branch connects to the hybrid coupler and the second circuit branch connects to the hybrid coupler.

8. The power amplifier of claim 1, wherein a maximum amount of output current from one of the peaking amplifiers differs by more than 20% from a maximum amount of current from the main amplifier.

9. The power amplifier of claim 1, further comprising signal dividing circuitry that divides a received input signal into four output signals that are provided to the main amplifier, the first peaking amplifier, the second peaking amplifier, and the third peaking amplifier, wherein at least one of the four output signals provided to a peaking amplifier is delayed in phase by an amount between 80 degrees and 100 degrees with respect to a phase of an output signal provided to the main amplifier.

10. The power amplifier of claim 1, wherein current ratios for the peaking amplifiers with respect to the main amplifier are selected such that the power amplifier exhibits a peak in efficiency for an output power back-off value that is between −10 dB and −6.5 dB.

11. The power amplifier of claim 1, wherein a maximum current delivered from the second peaking amplifier is between 1 and 3 times a maximum amount of current delivered from the main amplifier when the main amplifier and the second peaking amplifier are fully amplifying.

12. The power amplifier of claim 1, wherein the current ratios r1, r2, and r3 for the peaking amplifiers satisfy the following relation $$\frac{(1+r1)^2}{(1+r1+r2+r3)} = 1 \pm 0.2$$

where r1 is a ratio of a maximum amount of current delivered by the first peaking amplifier to a maximum amount of current delivered by the main amplifier when main amplifier and first peaking amplifier are fully amplifying, r2 is a ratio of a maximum amount of current delivered by the second peaking amplifier to a maximum amount of current delivered by the main amplifier when the main amplifier and the second peaking amplifier are fully amplifying, and r3 is a ratio of a maximum amount of current delivered by the third peaking amplifier to a maximum amount of current delivered by the main amplifier when the main amplifier and third peaking amplifier are fully amplifying.

13. The power amplifier of claim 1, wherein the first peaking amplifier, the second peaking amplifier, and the third peaking amplifier are configured to turn on at different levels of input signal power as compared to each other.

14. A power amplifier comprising:
a main amplifier connected in parallel with a first peaking amplifier in a first circuit branch;
a second peaking amplifier in a second circuit branch that is in parallel with the first circuit branch; and
a first impedance inverter in the first circuit branch and a second impedance inverter in the second circuit branch, wherein:
current ratios for the peaking amplifiers with respect to the main amplifier set a load impedance seen by the main amplifier to approximately a same value when the peaking amplifiers are fully amplifying received signals and when the peaking amplifiers are not amplifying received signals.

15. The power amplifier of claim 14, wherein a load impedance seen by the main amplifier is approximately R when the peaking amplifiers are fully amplifying received signals and when the peaking amplifiers are not amplifying received signals.

16. The power amplifier of claim 14, further comprising a combining node at which the first circuit branch connects to the second circuit branch, wherein the combining node comprises an electrode of a capacitor.

17. The power amplifier of claim 16, further comprising a plurality of bond wires connecting outputs from the main amplifier, the first peaking amplifier, and the second peaking amplifier to the electrode of the capacitor.

18. The power amplifier of claim 14, wherein the current ratios r1 and r2 for the peaking amplifiers satisfy the following relation $$\frac{(1+r1)^2}{(1+r1+r2)} = 1 \pm 0.2$$

where r1 is a ratio of a maximum amount of current delivered by the first peaking amplifier to a maximum amount of current delivered by the main amplifier when main amplifier and first peaking amplifier are fully amplifying, and r2 is a ratio of a maximum amount of current delivered by the second peaking amplifier to a maximum amount of current delivered by the main amplifier when the main amplifier and the second peaking amplifier are fully amplifying.

19. The power amplifier of claim 14, wherein the first peaking amplifier and the second peaking amplifier are configured to turn on at different levels of input signal power as compared to each other.

20. The power amplifier of claim 14, further comprising a hybrid coupler, wherein the first circuit branch connects to the hybrid coupler and the second circuit branch connects to the hybrid coupler.

* * * * *